(12) United States Patent
Wakabayashi et al.

(10) Patent No.: US 12,152,940 B2
(45) Date of Patent: Nov. 26, 2024

(54) SENSOR DEVICE

(71) Applicant: SONY SEMICONDUCTOR SOLUTIONS CORPORATION, Kanagawa (JP)

(72) Inventors: Takahiro Wakabayashi, Kumamoto (JP); Kenichi Taguchi, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 231 days.

(21) Appl. No.: 17/784,289

(22) PCT Filed: Dec. 21, 2020

(86) PCT No.: PCT/JP2020/047751
§ 371 (c)(1),
(2) Date: Jun. 10, 2022

(87) PCT Pub. No.: WO2021/132184
PCT Pub. Date: Jul. 1, 2021

(65) Prior Publication Data
US 2022/0381617 A1 Dec. 1, 2022

(30) Foreign Application Priority Data
Dec. 27, 2019 (JP) .................................. 2019-239632

(51) Int. Cl.
*G01J 5/061* (2022.01)
*G01J 5/00* (2022.01)
(52) U.S. Cl.
CPC ....... *G01J 5/061* (2013.01); *G01J 2005/0077* (2013.01); *G01J 2005/062* (2013.01)

(58) Field of Classification Search
CPC ............... G01J 5/061; G01J 2005/0077; G01J 2005/062; H10N 10/13; H01L 23/34; H01L 27/14605; H01L 27/14618; H01L 27/14636; H01L 31/02005; H01L 31/0203; H01L 31/024; H01L 27/14669; H01L 23/38; H04N 23/52; H04N 25/79
See application file for complete search history.

(56) References Cited

U.S. PATENT DOCUMENTS 4,926,227 A 5/1990 Jensen
5,508,740 A * 4/1996 Miyaguchi ............ H01L 31/024
348/E5.025

(Continued)

FOREIGN PATENT DOCUMENTS

JP H07-38019 2/1995
JP 2003-258221 9/2003

(Continued)

OTHER PUBLICATIONS

International Search Report and Written Opinion prepared by the Japan Patent Office on Mar. 4, 2021, for International Application No. PCT/JP2020/047751, 3 pgs.

*Primary Examiner* — David P Porta
*Assistant Examiner* — Meenakshi S Sahu
(74) *Attorney, Agent, or Firm* — Sheridan Ross PC

(57) ABSTRACT

A sensor device according to the present disclosure includes a Peltier element, a sensor element thermally connected to a cooling surface of the Peltier element, and a window member that faces a light receiving surface of the sensor element and is made of borosilicate glass.

11 Claims, 16 Drawing Sheets

(56) References Cited

U.S. PATENT DOCUMENTS

| | | | |
|---|---|---|---|
| 6,440,778 B1 | 8/2002 | Okada | |
| 8,546,758 B2 * | 10/2013 | Nagai | H01L 31/109 |
| | | | 257/199 |
| 2010/0102721 A1 * | 4/2010 | Fukasawa | H01J 43/28 |
| | | | 313/544 |
| 2015/0035989 A1 * | 2/2015 | Inada | H04N 25/63 |
| | | | 348/164 |

FOREIGN PATENT DOCUMENTS

| | | |
|---|---|---|
| JP | 2010-103097 | 5/2010 |
| JP | 2011-037694 | 2/2011 |
| JP | 2015-032707 | 2/2015 |
| WO | WO 2019/131134 | 7/2019 |

\* cited by examiner

SENSOR DEVICE

CROSS REFERENCE TO RELATED APPLICATIONS

This application is a national stage application under 35 U.S.C. 371 and claims the benefit of PCT Application No. PCT/JP2020/047751, having an international filing date of 21 Dec. 2020, which designated the United States, which PCT application claimed the benefit of Japanese Patent Application No. 2019-239632, filed 27 Dec. 2019, the entire disclosures of each of which are incorporated herein by reference.

FIELD

The present disclosure relates to a sensor device.

BACKGROUND

As a means for cooling a sensor element, such as a solid-state imaging element, a hermetically sealed package incorporating a Peltier element is known (see, for example, Patent Literature 1).

CITATION LIST

Patent Literature

Patent Literature 1: JP 2003-258221 A

SUMMARY

Technical Problem

The present disclosure proposes a sensor device capable of improving detection sensitivity.

Solution to Problem

According to the present disclosure, there is provided a sensor device. The sensor device includes a Peltier element, a sensor element thermally connected to a cooling surface of the Peltier element, and a window member that faces a light receiving surface of the sensor element and is made of borosilicate glass.

DESCRIPTION OF EMBODIMENTS

Hereinafter, each embodiment of the present disclosure will be described in detail with reference to the drawings. Note that the same portions are denoted by the same reference signs in each of the following embodiments, and a repetitive description thereof will be omitted.

As a means for cooling a sensor element, such as a solid-state imaging element, a hermetically sealed package incorporating a Peltier element is known. In the hermetically sealed package, sapphire glass is used as a window member that allows detected light to be transmitted through the inside.

In the above technology, however, the sapphire glass has a wavelength region where the absorptivity increases, so that incident light is absorbed by the sapphire glass. Thus, there is a problem that detection sensitivity is lowered.

Therefore, it is expected to achieve a technology capable of overcoming the above-described problem and improving the detection sensitivity of a sensor device.

[Configuration of Sensor Element]

Figure 1:
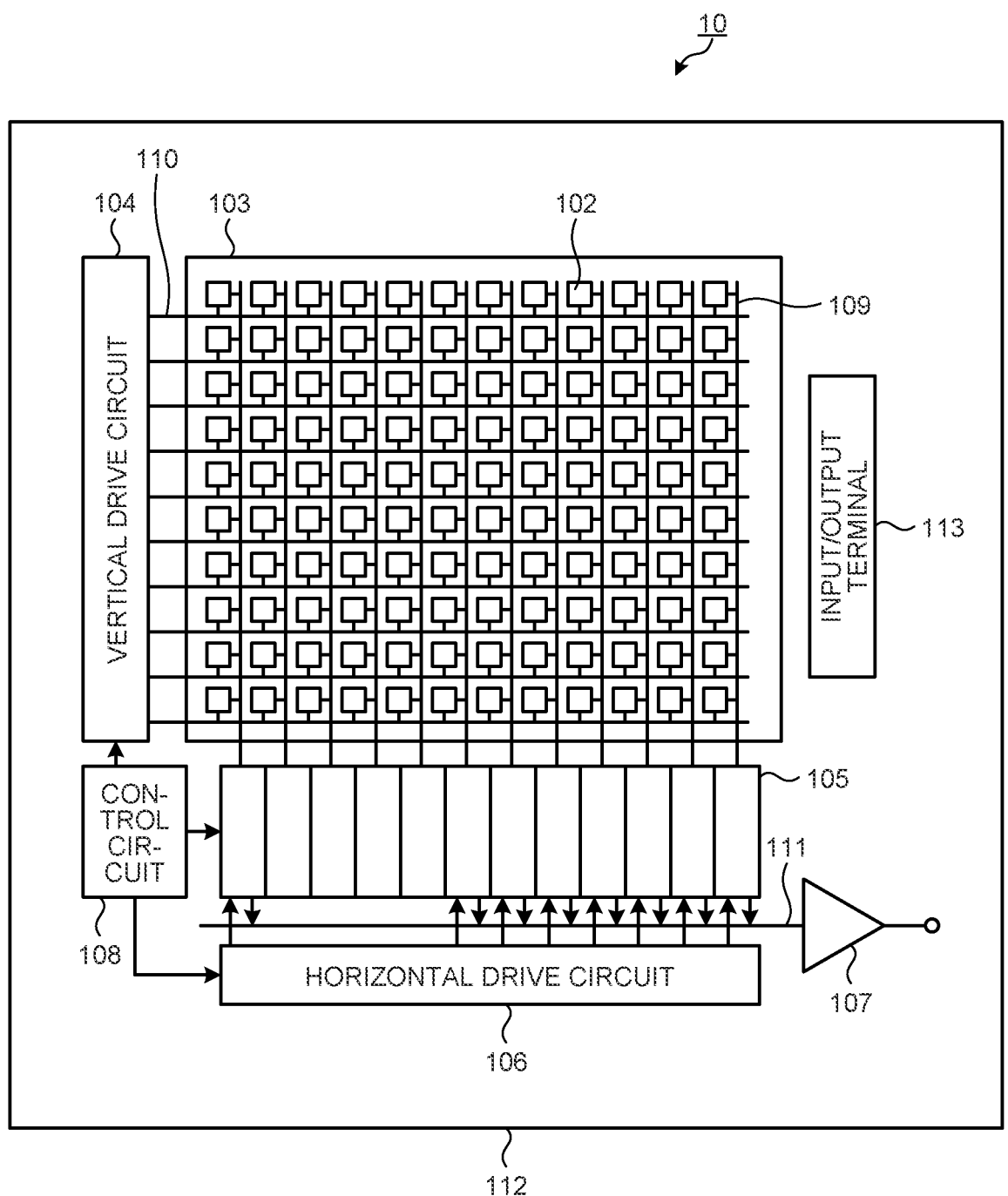
FIG. 1 is a diagram illustrating a schematic configuration of a sensor element according to an embodiment of the present disclosure.

First, a configuration of a sensor element 10 according to an embodiment will be described with reference to FIGS. 1 to 5. FIG. 1 is a diagram illustrating a schematic configuration of the sensor element 10 according to the embodiment of the present disclosure.

The sensor element 10 in FIG. 1 includes: a pixel array region 103 in which pixels 102 are two-dimensionally arranged in a matrix on a semiconductor substrate 112 using, for example, single crystal silicon (Si) as a semiconductor; and a peripheral circuit region 161 (see FIG. 4) in the periphery thereof. The peripheral circuit region 161 includes a vertical drive circuit 104, column signal processing circuits 105, a horizontal drive circuit 106, an output circuit 107, a control circuit 108, and the like.

The pixel 102 includes: a photoelectric conversion unit made of a semiconductor thin film; and a plurality of pixel transistors. The plurality of pixel transistors include, for example, three MOS transistors of a reset transistor, an amplification transistor, and a selection transistor.

The control circuit 108 receives an input clock and data giving an instruction on an operation mode and the like, and outputs data such as internal information of the sensor element 10. That is, the control circuit 238 generates a clock signal and a control signal serving as references of operations of the vertical drive circuit 234, the column signal processing circuit 235, the horizontal drive circuit 236, and the like based on a vertical synchronization signal, a horizontal synchronization signal, and a master clock.

Then, the control circuit 108 outputs the generated clock signal and control signal to the vertical drive circuit 104, the column signal processing circuit 105, the horizontal drive circuit 106, and the like.

The vertical drive circuit 104 includes, for example, a shift register, selects a predetermined pixel driving wiring 110, supplies a pulse for driving the pixel 102 to the selected pixel driving wiring 110, and drives the pixels 102 in units of rows.

That is, the vertical drive circuit 104 selectively scans the pixels 102 in the pixel array region 103 sequentially in the vertical direction in units of rows. Then, the vertical drive circuit 104 supplies a pixel signal based on a signal charge generated according to the amount of received light in the photoelectric conversion unit of each of the pixels 102 to the column signal processing circuit 105 through a vertical signal line 109.

The column signal processing circuit 105 is arranged for each column of the pixels 102, and performs signal processing such as noise removal on signals output from the pixels 102 of one row for each column. For example, the column signal processing circuit 105 performs signal processing such as correlated double sampling (CDS) and AD conversion to remove fixed pattern noise unique to each pixel.

The horizontal drive circuit 106 includes, for example, a shift register, and sequentially outputs horizontal scanning pulses to sequentially select each of the column signal processing circuits 105 such that a pixel signal is output from each of the column signal processing circuits 105 to a horizontal signal line 111.

The output circuit 107 performs signal processing on the signals sequentially supplied from the column signal processing circuits 105, respectively, through the horizontal signal line 111, and outputs the processed signals. For example, the output circuit 107 may perform only buffering, or may perform black level adjustment, column variation correction, various types of digital signal processing, and the like. A input/output terminal 113 exchanges signals with the outside.

The sensor element 10 configured as described above is a CMOS image sensor called a column AD system in which the column signal processing circuit 105 that performs CDS processing and AD conversion processing is arranged for each column.

Figure 2:
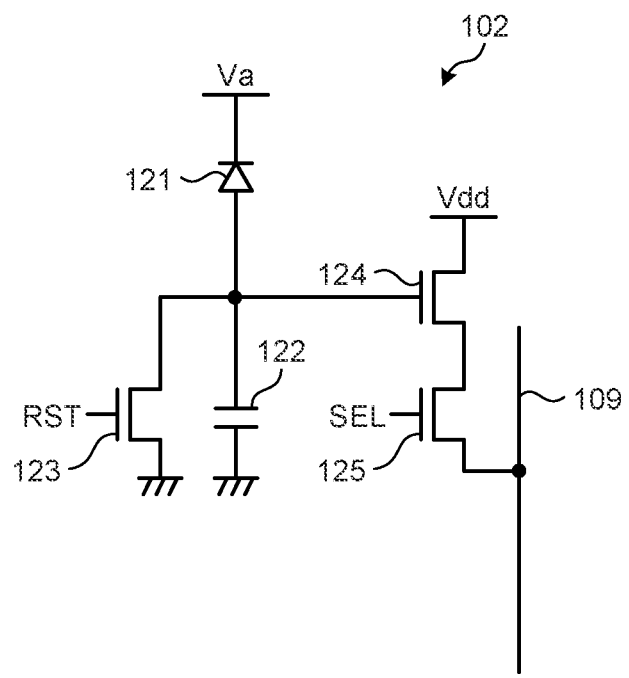
FIG. 2 is a diagram illustrating a pixel circuit of each pixel of the sensor element according to the embodiment of the present disclosure.

FIG. 2 is a diagram illustrating a pixel circuit of each pixel of the sensor element 10 according to the embodiment of the present disclosure. Each of the pixels 102 includes a photoelectric conversion unit 121, a capacitive element 122, a reset transistor 123, an amplification transistor 124, and a selection transistor 125.

The photoelectric conversion unit 121 is made of a semiconductor thin film using a compound semiconductor, such as InGaAs, and generates a charge (signal charge) corresponding to the amount of received light. A predetermined bias voltage Va is applied to the photoelectric conversion unit 121.

The capacitive element 122 accumulates the charge generated in the photoelectric conversion unit 121. The capacitive element 122 can include at least one of, for example, a pn junction capacitor, a MOS capacitor, or a wiring capacitor.

When being turned on by a reset signal RST, the reset transistor 123 resets a potential of the capacitive element 122 as the charge accumulated in the capacitive element 122 is discharged to a source (ground).

The amplification transistor 124 outputs a pixel signal according to the accumulated potential of the capacitive element 122. That is, the amplification transistor 124 constitutes a source follower circuit with a load MOS (not illustrated) as a constant current source connected via the vertical signal line 109.

As a result, a pixel signal indicating a level corresponding to the charge accumulated in the capacitive element 122 is output from the amplification transistor 124 to the column signal processing circuit 105 (see FIG. 1) via the selection transistor 125.

The selection transistor 125 is turned on when the pixel 102 is selected by a selection signal SEL, and outputs the pixel signal of the pixel 102 to the column signal processing circuit 105 via the vertical signal line 109. Each of signal lines through which a transfer signal TRX, the selection signal SEL, and the reset signal RST are transmitted corresponds to the pixel driving wiring 110 in FIG. 1.

Figure 3:
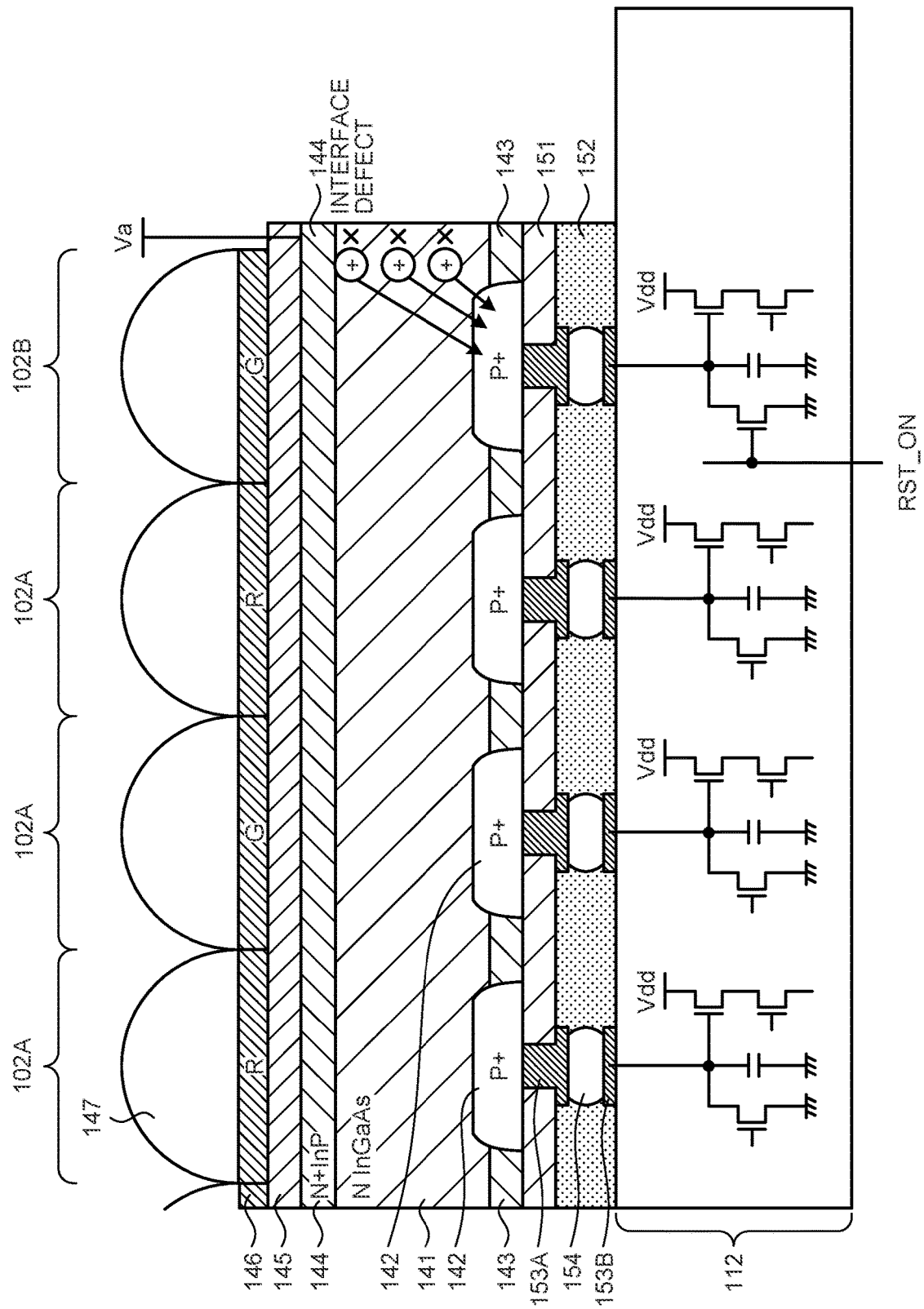
FIG. 3 is a cross-sectional view illustrating a structure of the pixel according to the embodiment of the present disclosure.

FIG. 3 is a cross-sectional view illustrating a structure of the pixel 102 according to the embodiment of the present disclosure. Although details will be described later, the pixels 102 in the pixel array region 103 are divided into ordinary pixels 102A and charge emitting pixels 102B depending on a difference in control of the reset transistor 123 in FIG. 3.

Meanwhile, pixel structures of the ordinary pixel 102A and the charge emitting pixel 102B are basically the same, and thus, simply the pixel 102 may be described hereinafter. Note that the charge emitting pixels 102B are arranged on the outermost side of the pixel array region 103 (see FIG. 1).

A readout circuit of the capacitive element 122, the reset transistor 123, the amplification transistor 124, and the selection transistor 125 of each of the pixels 102 described in FIG. 2 is formed for each of the pixels 102 on the semiconductor substrate 112 made of a single crystal material such as single crystal silicon.

Note that FIG. 3 does not illustrate reference signs of the capacitive element 122, the reset transistor 123, the amplification transistor 124, and the selection transistor 125 formed on the semiconductor substrate 112.

On the upper side, which is the light incident side, of the semiconductor substrate 112, an N-type semiconductor thin film 141 to be the photoelectric conversion unit 121 is formed on the entire surface of the pixel array region 103. The N-type semiconductor thin film 141 is made of InGaP, InAlP, InGaAs, InAlAs, or a compound semiconductor having a chalcopyrite structure.

The compound semiconductor having the chalcopyrite structure is a material capable of obtaining a high light absorption coefficient and high sensitivity over a wide wavelength range, and is preferably used as the N-type semiconductor thin film 141 for photoelectric conversion.

Such a compound semiconductor having the chalcopyrite structure is configured using elements around group IV elements such as Cu, Al, Ga, In, S, and Se, and examples thereof include CuGaInS mixed crystals, CuAlGaInS mixed crystals, and CuAlGaInSSe mixed crystals, and the like.

In addition, as a material of the N-type semiconductor thin film 141, amorphous silicon, germanium (Ge), a quantum dot photoelectric conversion film, an organic photoelectric conversion film, and the like can also be used in addition to the compound semiconductor described above. Note that it is assumed that a compound semiconductor of InGaAs is used as the N-type semiconductor thin film 141 in the present disclosure.

On the lower side, which is the semiconductor substrate 112 side, of the N-type semiconductor thin film 141, a high-concentration P-type layer 142 constituting a pixel electrode is formed for each of the pixels 102. Further, an N-type layer 143 as a pixel separation region, which isolates the respective pixels 102, is formed using a compound semiconductor such as InP, for example, between the high-concentration P-type layers 142 formed respectively for the pixels 102. The N-type layer 143 has not only the function as the pixel separation region but also as a role of preventing a dark current.

Meanwhile, an N-type layer 144 having a higher concentration than the N-type semiconductor thin film 141 is also formed on the upper side, which the light incident side, of the N-type semiconductor thin film 141 using the compound semiconductor such as InP used for the pixel separation region.

This high-concentration N-type layer 144 functions as a barrier layer that prevents reverse flow of a charge generated in the N-type semiconductor thin film 141. As a material of the high-concentration N-type layer 144, for example, a compound semiconductor such as InP, InGaAs, and InAlAs can be used.

An antireflection film 145 is formed on the high-concentration N-type layer 144 as the barrier layer. As a material of the antireflection film 145, for example, silicon nitride (SiN), hafnium oxide ($HfO_2$), aluminum oxide ($Al_2O_3$), zirconium oxide ($ZrO_2$), tantalum oxide ($Ta_2O_5$), titanium oxide ($TiO_2$), or the like can be used.

Either the high-concentration N-type layer 144 or the antireflection film 145 also functions as an upper electrode on the upper side among electrodes vertically sandwiching the N-type semiconductor thin film 141, and a predetermined voltage Va is applied to the high-concentration N-type layer 144 or the antireflection film 145 as the upper electrode.

A color filter 146 and an on-chip lens 147 are further formed on the antireflection film 145. The color filter 146 is a filter that transmits light (wavelength light) of any of red (R), green (G), and blue (B), and is arranged in a so-called Bayer array in the pixel array region 103, for example.

A passivation layer 151 and an insulating layer 152 are formed on the lower side of the high-concentration P-type layer 142 constituting the pixel electrode and the N-type layer 143 as the pixel separation region. Further, connection electrodes 153A and 153B and a bump electrode 154 are formed so as to penetrate the passivation layer 151 and the insulating layer 152.

The connection electrodes 153A and 153B and the bump electrode 154 electrically connect the high-concentration P-type layer 142 constituting the pixel electrode and the capacitive element 122 accumulating the charge.

The ordinary pixel 102A and the charge emitting pixel 102B are configured as described above, and have the same pixel structure. However, a method of controlling the reset transistor 123 is different between the ordinary pixel 102A and the charge emitting pixel 102B.

In the ordinary pixel 102A, the reset transistor 123 is turned on/off based on the reset signal RST according to a charge generation period (light reception period) by the photoelectric conversion unit 121, a reset period of the potential of the capacitive element 122 before the start of light reception, and the like. On the other hand, the reset transistor 123 is always controlled to be turned on in the charge emitting pixel 102B.

As a result, the charge generated in the photoelectric conversion unit 121 is discharged to the ground, and a constant voltage Va is always applied to the charge emitting pixel 102B.

Figure 4:
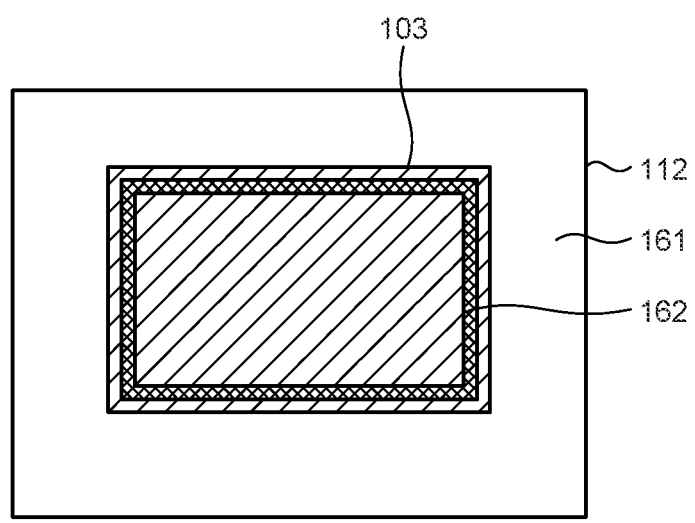
FIG. 4 is a plan view of a pixel array region illustrating a pixel arrangement of a charge emitting pixel.

FIG. 4 is a plan view of the pixel array region 103 illustrating a pixel arrangement of the charge emitting pixel 102B. The pixel array region 103 is arranged inside the peripheral circuit region 161 in which the vertical drive circuit 104, the column signal processing circuit 105, and the like are formed. The outermost one row and one column of the pixel array region 103 are set as charge emission regions 162 in which the charge emitting pixels 102B are arranged.

Note that the charge emission region 162 may include a plurality of rows and a plurality of columns including at least the outermost one row and one column of the pixel array region 103 having a rectangular shape.

In the pixels 102 located in the outermost column and row on each side of the rectangular pixel array region 103, a dark current is likely to be generated by the influence from a processed portion interface (processed portion end surface) of the photoelectric conversion unit 121 that is the compound semiconductor as illustrated in FIG. 3.

In particular, in a case where the readout circuit formed on the semiconductor substrate 112 is a circuit of a source follower type, a potential difference of a pixel decreases as the charge is accumulated, and thus, a dark current component affects the adjacent pixel one after another due to blooming.

Therefore, in the embodiment, the pixels 102 located in the outermost column and row on each side of the rectangular pixel array region 103 are set as the charge emitting pixels 102B controlled such that the reset transistor 123 is always turned on.

As a result, gush-out of the charge from the end surface of the processed portion (processed portion interface) of the N-type semiconductor thin film 141, which is the photoelectric conversion unit 121, is concentrated on and discharged to the charge emitting pixel 102B. As a result, it is possible to prevent the charge from flowing into the ordinary pixels 102A on the inner side in the charge emission region 162.

As described above, it is possible to suppress image quality deterioration due to the gush-out of the charge from the processed portion interface of the N-type semiconductor thin film 141 according to the embodiment.

Figure 5:
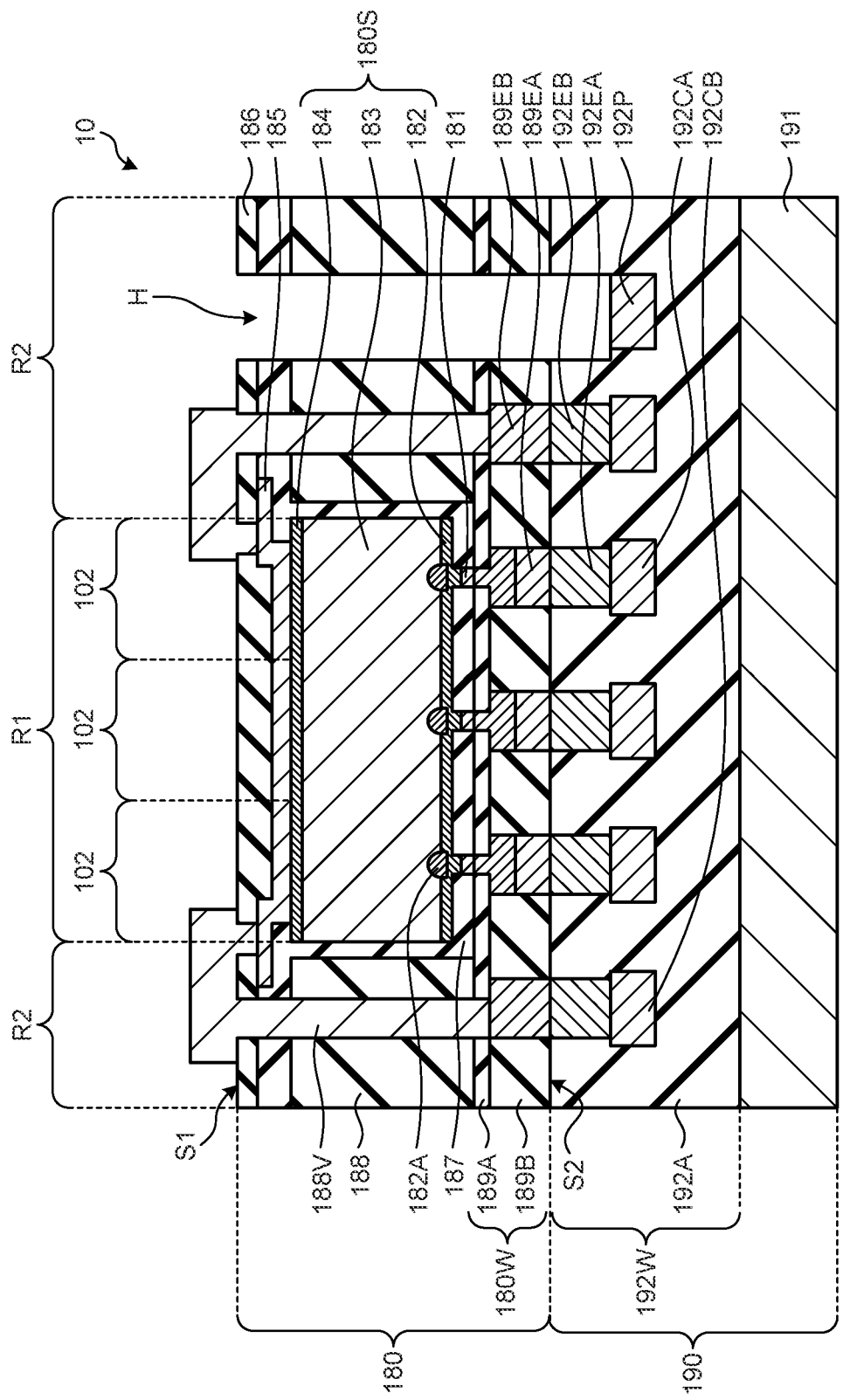
FIG. 5 is a view illustrating a schematic cross-sectional configuration of the sensor element according to the embodiment of the present disclosure.

FIG. 5 is a view illustrating a schematic cross-sectional configuration of the sensor element 10 according to the embodiment of the present disclosure. The sensor element 10 is applied to, for example, an infrared sensor using a compound semiconductor material such as a III-V group semiconductor.

The sensor element 10 has a photoelectric conversion function with respect to light having a wavelength in a visible region (for example, 380 nm or more and less than 780 nm) to a short infrared region (for example, 780 nm or more and less than 2500 nm), for example. The sensor element 10 is provided with, for example, a plurality of light receiving unit regions (the pixels 102) arranged two-dimensionally. FIG. 5 illustrates a cross-sectional configuration of a portion corresponding to the three pixels 102.

The sensor element 10 has a stacked structure of an element substrate 180 and a circuit board 190. One surface of the element substrate 180 is a light incident surface (light incident surface S1), and a surface (the other surface) opposite to the light incident surface S1 is a junction surface (junction surface S2) with the circuit board 190.

The element substrate 180 includes a wiring layer 180W including a first electrode 181, a semiconductor layer 180S, a second electrode 185, and a passivation film 186 in this order from a position closer to the circuit board 190.

The semiconductor layer 180S has a surface facing the wiring layer 180W and an end surface (side surface) which are covered with an insulating film 187. The circuit board 190 includes a wiring layer 192W in contact with the junction surface S2 of the element substrate 180, and a support substrate 191 facing the element substrate 180 with the wiring layer 192W interposed therebetween.

An element region R1, which is an effective pixel region, is provided in a central portion of the element substrate 180, and the semiconductor layer 180S is arranged in the element region R1. In other words, a region where the semiconductor layer 180S is provided is the element region R1.

A peripheral region R2 surrounding the element region R1 is provided outside the element region R1. In the peripheral region R2 of the element substrate 180, a buried layer 188 is provided together with the insulating film 187. In the sensor element 10, light is incident on the semiconductor layer 180S from the light incident surface S1 of the element substrate 180 via the passivation film 186, the second electrode 185, and a second contact layer 184.

A signal charge photoelectrically converted by the semiconductor layer 180S moves through the wiring layer 180W and is read out by the circuit board 190. Hereinafter, a configuration of each portion will be described.

The wiring layer 180W is provided over the element region R1 and the peripheral region R2, and has the junction surface S2 with the circuit board 190. In the sensor element 10, the junction surface S2 of the element substrate 180 is provided in the element region R1 and the peripheral region R2. For example, the junction surface S2 in the element region R1 and the junction surface S2 in the peripheral region R2 constitute the same plane.

In the sensor element 10, the junction surface S2 of the peripheral region R2 is formed by providing the buried layer 188 as will be described later.

The wiring layer 180W includes, for example, the first electrode 181 and contact electrodes 189EA and 189EB in interlayer insulating films 189A and 189B. For example, the interlayer insulating film 189B is arranged on the circuit board 190 side, the interlayer insulating film 189A is arranged on a first contact layer 182 side, and these interlayer insulating films 189A and 189B are stacked.

The interlayer insulating films 189A and 189B are made of, for example, an inorganic insulating material. Examples of the inorganic insulating material include silicon nitride, aluminum oxide, silicon oxide ($SiO_2$), and hafnium oxide, and the like. The interlayer insulating films 189A and 189B may be made of the same inorganic insulating material.

The first electrode 181 is an electrode (anode) supplied with a voltage for reading out a signal charge (a hole or an electron, hereinafter, the description will be given assuming the signal charge as the hole for convenience) generated in a photoelectric conversion layer 183, and is provided in the element region R1 for each of the pixels 102.

The first electrode 181 provided in the wiring layer 180W is in contact with the semiconductor layer 180S (more specifically, the first contact layer 182 to be described later) through the interlayer insulating film 189A and a connection hole of the insulating film 187. The adjacent first electrodes 181 are electrically separated by the interlayer insulating film 189B.

The first electrode 181 is made of, for example, any single substance of titanium, tungsten, titanium nitride (TiN), platinum, and gold, germanium, palladium, zinc, nickel, and aluminum, or an alloy containing at least one kind of them. The first electrode 181 may be a single film made of such a constituent material or a stacked film obtained by combining two or more kinds. For example, the first electrode 181 is made of a stacked film of titanium and tungsten.

The contact electrode 189EA is configured to electrically connect the first electrode 181 and the circuit board 190, and is provided for each of the pixels 102 in the element region R1. The adjacent contact electrodes 189EA are electrically separated by the interlayer insulating film 189B.

The contact electrode 189EB electrically connects the second electrode 185 and a wiring (wiring 192CB to be described later) of the circuit board 190, and is arranged in the peripheral region R2. The contact electrode 189EB is formed in the same process as the contact electrode 189EA, for example. The contact electrodes 189EA and 189EB are configured using, for example, copper (Cu) pads and are exposed to the junction surface S2.

The semiconductor layer 180S includes, for example, the first contact layer 182, the photoelectric conversion layer 183, and the second contact layer 184 from a position closer to the wiring layer 180W. The first contact layer 182, the photoelectric conversion layer 183, and the second contact layer 184 have the same planar shape, and end surfaces thereof are arranged at the same position in a plan view.

The first contact layer 182 is provided in common to all the pixels 102, for example, and is arranged between the insulating film 187 and the photoelectric conversion layer 183. The first contact layer 182 is configured to electrically separate the adjacent pixels 102, and the first contact layer 182 is provided with, for example, a plurality of diffusion regions 182A.

When the first contact layer 182 is formed using a compound semiconductor material having a band gap larger than a band gap of a compound semiconductor material forming the photoelectric conversion layer 183, a dark current can also be suppressed. The first contact layer 182 can be made of, for example, N-type InP.

The diffusion regions 182A provided on the first contact layer 182 are arranged apart from each other. The diffusion region 182A is arranged for each of the pixels 102, and the first electrodes 181 are connected to the diffusion regions 182A, respectively.

The diffusion region 182A is configured to read out the signal charge generated in the photoelectric conversion layer 183 for each of the pixels 102, and contains, for example, a p-type impurity. Examples of the p-type impurity include Zn and the like.

In this manner, a pn junction interface is formed between the diffusion region 182A and the first contact layer 182 other than the diffusion region 182A so that the adjacent pixels 102 are electrically separated. The diffusion region 182A is provided, for example, in the thickness direction of the first contact layer 182, and is also provided in a part of the photoelectric conversion layer 183 in the thickness direction.

The photoelectric conversion layer 183 between the first electrode 181 and the second electrode 185, more specifically, between the first contact layer 182 and the second contact layer 184 is provided in common to all the pixels 102, for example.

The photoelectric conversion layer 183 absorbs light having a predetermined wavelength to generate the signal charge, and is made of, for example, a compound semiconductor material such as an i-type group III-V semiconductor. Examples of the compound semiconductor material forming the photoelectric conversion layer 183 include InGaAs, InAsSb, InAs, InSb, HgCdTe, and the like.

In addition, the photoelectric conversion layer 183 may be made of Ge. The photoelectric conversion layer 183 enables photoelectric conversion of light having wavelengths from the visible region to the short infrared region.

The second contact layer 184 is provided in common to all the pixels 102, for example. The second contact layer 184 is provided between the photoelectric conversion layer 183 and the second electrode 185, and is in contact with the both.

The second contact layer 184 is a region where a charge discharged from the second electrode 185 moves, and is made of, for example, a compound semiconductor containing an n-type impurity. The second contact layer 184 can be made of, for example, N-type InP.

The second electrode 185 is provided on the second contact layer 184 (light incident side) in contact with the second contact layer 184, for example, as an electrode common to the respective pixels 102. The second electrode 185 is configured to discharge a charge that is not used as a signal charge among charges generated in the photoelectric conversion layer 183 (cathode).

For example, when a hole is read out from the first electrode 181 as the signal charge, for example, an electron can be discharged through the second electrode 185. The second electrode 185 is made of a conductive film capable of transmitting incident light such as an infrared ray. The second electrode 185 can be made of, for example, indium tin oxide (ITO), ITiO ($In_2O_3$—$TiO_2$), or the like.

The passivation film 186 covers the second electrode 185 from the light incident surface S1 side. The passivation film 186 may have an antireflection function. The passivation film 186 can be made of, for example, silicon nitride, aluminum oxide, silicon oxide, tantalum oxide, or the like.

The insulating film 187 is provided between the first contact layer 182 and the wiring layer 180W, and covers the end surface of the first contact layer 182, the end surface of the photoelectric conversion layer 183, the end surface of the second contact layer 184, and an end surface of the second electrode 185. In addition, the insulating film 187 is in contact with the passivation film 186 in the peripheral region R2.

The insulating film 187 includes, for example, an oxide such as silicon oxide ($SiO_x$) and aluminum oxide. The insulating film 187 may be formed using a stacked structure including a plurality of films.

The insulating film 187 may be made of, for example, a silicon (Si)-based insulating material such as silicon oxynitride (SiON), carbon-containing silicon oxide (SiOC), silicon nitride, and silicon carbide (SiC).

The buried layer 188 is configured to fill a step between a temporary substrate (not illustrated) and the semiconductor layer 180S in a manufacturing process of the sensor element 10. Since the buried layer 188 is formed in the present embodiment, the occurrence of a defect in the manufacturing process caused by the step between the semiconductor layer 180S and the temporary substrate is suppressed although details will be described later.

The buried layer 188 in the peripheral region R2 is provided between the wiring layer 180W and the passivation film 186, and has the thickness equal to or larger than the thickness of the semiconductor layer 180S, for example. Here, the buried layer 188 surrounds the semiconductor layer 180S, and thus, the region (peripheral region R2) around the semiconductor layer 180S is formed.

As a result, the junction surface S2 with the circuit board 190 can be provided in the peripheral region R2. The thickness of the buried layer 188 may be reduced as long as the junction surface S2 is formed in the peripheral region R2, but it is preferable that the buried layer 188 cover the semiconductor layer 180S in the thickness direction such that the entire end surface of the semiconductor layer 180S is covered with the buried layer 188.

The buried layer 188 covers the entire end surface of the semiconductor layer 180S with the insulating film 187 interposed therebetween, thereby effectively suppressing entry of moisture into the semiconductor layer 180S.

A surface of the buried layer 188 on the junction surface S2 side is planarized, and the wiring layer 180W is provided on the planarized surface of the buried layer 188 in the peripheral region R2. The buried layer 188 can be made of, for example, an inorganic insulating material such as silicon oxide, silicon nitride, silicon oxynitride, carbon-containing silicon oxide, and silicon carbide.

The buried layer 188 is provided with through electrodes 188V. The through electrode 188V is configured to connect the second electrode 185 and the wiring (wiring 192CB described later) of the circuit board 190, and is partially provided on the passivation film 186.

One of the through electrodes 188V penetrates the passivation film 186 from above the passivation film 186 and is connected to the second electrode 185. The other of the through electrodes 188V penetrates the passivation film 186, the insulating film 187, the buried layer 188, and the interlayer insulating film 189A from above the passivation film 186 and is connected to the contact electrode 189EB.

The support substrate 191 of the circuit board 190 is configured to support the wiring layer 192W, and is made of, for example, silicon (Si). The wiring layer 192W includes, for example, contact electrodes 192EA and 192EB, a pixel circuit 192CA, a wiring 192CB, and a pad electrode 192P in an interlayer insulating film 192A.

The interlayer insulating film 192A is made of, for example, an inorganic insulating material. Examples of the inorganic insulating material include silicon nitride, aluminum oxide, silicon oxide, and hafnium oxide, and the like The contact electrode 192EA is configured to electrically connect the first electrode 181 and the pixel circuit 192CA, and is in contact with the contact electrode 189EA at the junction surface S2 of the element substrate 180. The adjacent contact electrodes 192EA are electrically separated by the interlayer insulating film 192A.

The contact electrode 192EB is configured to electrically connect the second electrode 185 and the wiring 192CB of the circuit board 190, and is in contact with the contact electrode 189EB at the junction surface S2 of the element substrate 180. The contact electrode 192EB is formed in the same process as the contact electrode 192EA, for example.

The through electrode 188V may be connected to the wiring 192CB without providing the contact electrodes 189EB and 192EB. The contact electrodes 192EA and 192EB are made of, for example, copper pads, and are exposed to a surface of the circuit board 190 facing the element substrate 180.

That is, a Cu—Cu junction, for example, is formed between the contact electrode 189EA and the contact electrode 192EA, and between the contact electrode 189EB and the contact electrode 192EB.

The pixel circuit 192CA is provided for each of the pixels 102, and is connected to the contact electrode 192EA. The pixel circuit 192CA constitutes an ROIC. The wiring 192CB connected to the contact electrode 192EB is connected to, for example, a predetermined potential.

In this manner, one (for example, a hole) of the charge generated in the photoelectric conversion layer 183 is read out from the first electrode 181 to the pixel circuit 192CA via the contact electrodes 189EA and 192EA.

In addition, the other (for example, an electron) of the charge generated in the photoelectric conversion layer 183 is discharged from the second electrode 185 to a predetermined potential via the through electrode 188V and the contact electrodes 189EB and 192EB.

The pad electrode 192P is configured for electrical connection with the outside. The sensor element 10 is provided with a hole H that penetrates the element substrate 180 and reaches the pad electrode 192P, and the electrical connection with the outside is achieved through the hole H. The connection is achieved, for example, by a method such as wire bond or bump.

[Configuration of Sensor Device]

Figure 6:
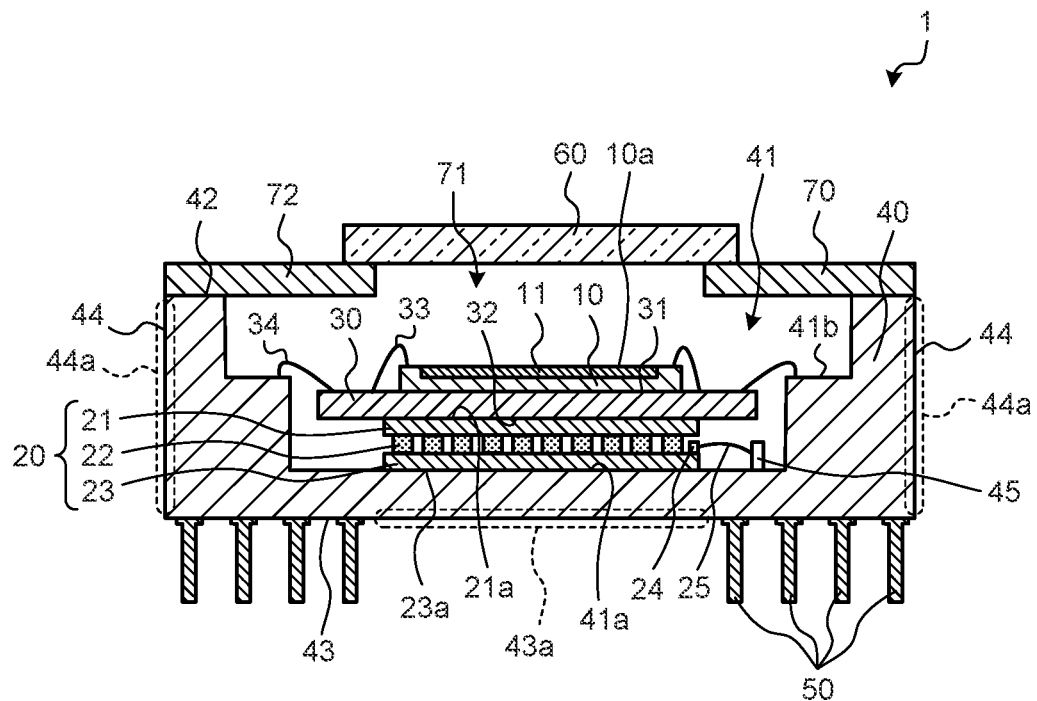
FIG. 6 is a cross-sectional view illustrating a configuration example of a sensor device according to the embodiment of the present disclosure.
Figure 7:
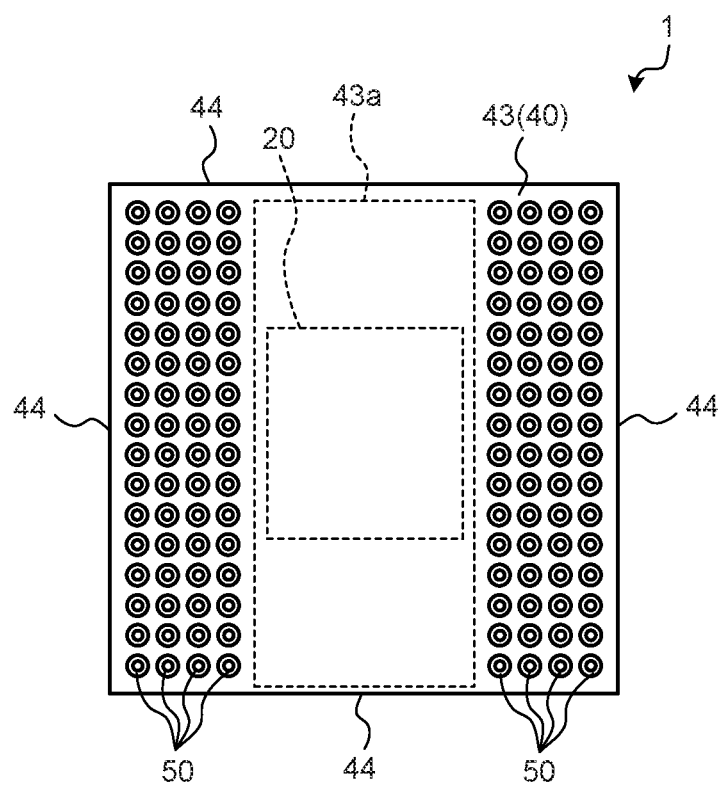
FIG. 7 is a bottom view illustrating the configuration example of the sensor device according to the embodiment of the present disclosure.

Next, a configuration of a sensor device 1 according to the embodiment will be described. FIG. 6 is a cross-sectional view illustrating a configuration example of the sensor device 1 according to the embodiment of the present disclosure, and FIG. 7 is a bottom view illustrating the configuration example of the sensor device 1 according to the embodiment of the present disclosure.

The sensor device 1 according to the embodiment is a sensor device that has a package structure whose inside is hermetically sealed, and receives light transmitted through a window member 60 by the sensor element 10 inside. Note that, in the following description, a side on which the window member 60 is provided in the sensor device 1 is defined as an upper side for convenience to indicate the up-down direction.

As illustrated in FIG. 6, the sensor device 1 according to the embodiment includes the sensor element 10, a Peltier element 20, a relay substrate 30, a package substrate 40, a plurality of pin terminals 50, the window member 60, and a support member 70. The plurality of pin terminals 50 correspond to an example of an external terminal.

The sensor element 10 has an effective pixel region 11 on a light receiving surface 10a which is a major surface (an upper surface in the drawing). The plurality of pixels 102 (see FIG. 1) converting received light into electrical signals are formed in the effective pixel region 11.

The sensor element 10 according to the embodiment is, for example, a short wave infrared (SWIR) image sensor such as an InGaAs image sensor. That is, the sensor element 10 according to the embodiment has the pixel that convers light having a short wave infrared region (for example, light having a wavelength of 400 nm to 2500 nm) into the electrical signal.

The Peltier element 20 includes a cooling substrate 21, a columnar portion 22, and a heat dissipation substrate 23, and the cooling substrate 21, the columnar portion 22, and the heat dissipation substrate 23 are stacked in this order from above.

Figure 8:
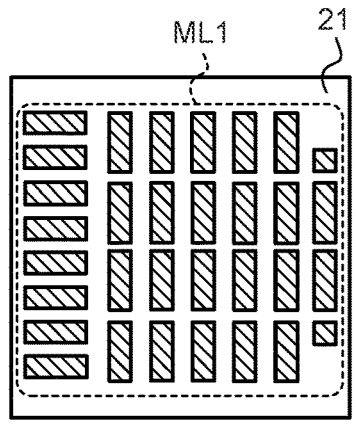
FIG. 8 is a top view illustrating a configuration example of a cooling substrate of a Peltier element according to the embodiment of the present disclosure.

FIG. 8 is a top view illustrating a configuration example of the cooling substrate 21 of the Peltier element 20 according to the embodiment of the present disclosure. As illustrated in FIG. 8, a metal layer ML1, which is formed using a copper thin film or the like and has a predetermined pattern, is formed on a surface (lower surface in FIG. 6) of the cooling substrate 21 facing the columnar portion 22. Note that FIG. 8 illustrates an arrangement of the metal layer ML1 in a top view in order to facilitate understanding.

Figure 9:
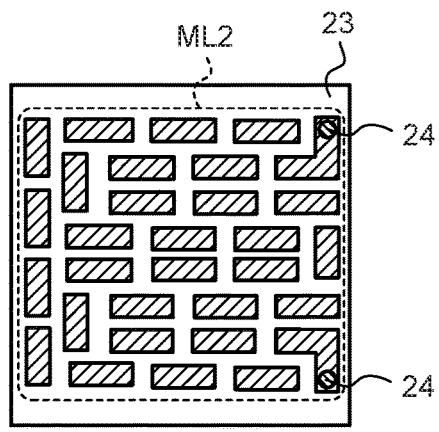
FIG. 9 is a top view illustrating a configuration example of a heat dissipation substrate of the Peltier element according to the embodiment of the present disclosure.

FIG. 9 is a top view illustrating a configuration example of the heat dissipation substrate 23 of the Peltier element 20 according to the embodiment of the present disclosure. As illustrated in FIG. 9, a metal layer ML2, which is formed using a copper thin film or the like and has a predetermined pattern, is formed on a surface (upper surface in FIG. 6) of the heat dissipation substrate 23 facing the columnar portion 22. In addition, a pair of electrodes 24 is provided at a predetermined site of the metal layer ML2 in the heat dissipation substrate 23.

Figure 10:
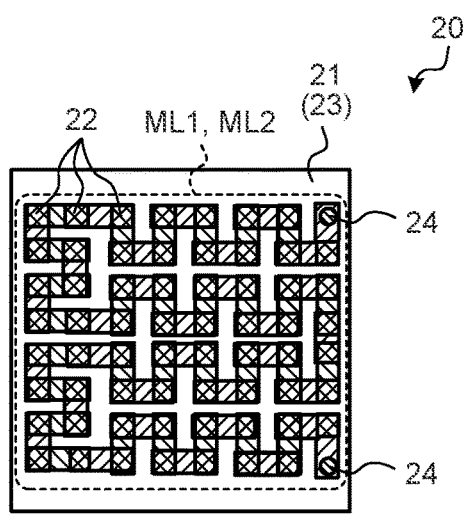
FIG. 10 is a top view illustrating a configuration example of the Peltier element according to the embodiment of the present disclosure.

Then, the columnar portion 22 is sandwiched between the cooling substrate 21 illustrated in FIG. 8 and the heat dissipation substrate 23 illustrated in FIG. 9, thereby forming the Peltier element 20 as illustrated in FIG. 10. FIG. 10 is a top view illustrating a configuration example of the Peltier element 20 according to the embodiment of the present disclosure.

As illustrated in FIG. 10, the metal layer ML1 of the cooling substrate 21 and the metal layer ML2 of the heat dissipation substrate 23 are aligned, and the columnar portion 22 is arranged at a site where both the metal layer ML1 and the metal layer ML2 are arranged.

As a result, a unicursal electric circuit, formed of the metal layer ML1, the metal layer ML2, and the columnar portion 22, is formed between one electrode 24 and the other electrode 24 inside the Peltier element 20.

In addition, the columnar portion 22 includes a P-type thermoelectric semiconductor having a columnar shape and an N-type thermoelectric semiconductor having a columnar shape. Each of the P-type thermoelectric semiconductor and the N-type thermoelectric semiconductor has one end connected to the metal layer ML1 and the other end connected to the metal layer ML2. Then, the P-type thermoelectric semiconductor and the N-type thermoelectric semiconductor of the columnar portion 22 are alternately connected in series through the metal layer ML1 and the metal layer ML2.

As a result, when a DC current flows from the N-type thermoelectric semiconductor side in the Peltier element 20, the cooling substrate 21 absorbs heat from a cooling surface 21a (see FIG. 6) to be cooled, and the heat dissipation substrate 23 dissipates the heat absorbed by the cooling substrate 21 from a heat dissipation surface 23a (see FIG. 6).

The cooling surface 21a is a surface of the cooling substrate 21 on the opposite side of a surface to which the columnar portion 22 is joined (that is, the surface on which the metal layer ML1 is arranged). The heat dissipation surface 23a is a surface of the heat dissipation substrate 23 on the opposite side of a surface to which the columnar portion 22 is joined (that is, the surface on which the metal layer ML2 is arranged).

The description returns to FIG. 6. The relay substrate 30 is arranged between the cooling surface 21a of the Peltier element 20 and the sensor element 10. For example, the sensor element 10 is joined to a front surface 31 of the relay substrate 30 via an adhesive (not illustrated) or the like, and the cooling surface 21a of the Peltier element 20 is joined to a back surface 32 of the relay substrate 30 via an adhesive (not illustrated) or the like.

As a result, the sensor element 10 is thermally connected to the cooling surface 21a of the Peltier element 20 via the relay substrate 30.

In addition, the relay substrate 30 has a wiring layer (not illustrated) on the surface or inside, and relays the electrical connection between the sensor element 10 and the package substrate 40 by the wiring layer.

For example, the wiring layer of the relay substrate 30 and the sensor element 10 are electrically connected by a bonding wire 33. In addition, the wiring layer of the relay substrate 30 and a bonding pad (not illustrated) provided in stepped portion 41b of the package substrate 40 are electrically connected by a bonding wire 34. As a result, the relay substrate 30 can relay the electrical connection between the sensor element 10 and the package substrate 40.

The relay substrate 30 is, for example, an interposer substrate made of ceramic. Note that the relay substrate 30 is not limited to the substrate made of ceramic, and may be a printed board made of resin or the like.

The package substrate 40 is made of a ceramic having a high thermal conductivity, such as alumina ($Al_2O_3$), aluminum nitride (AlN), and silicon nitride ($Si_3N_4$), and accommodates the sensor element 10, the Peltier element 20, and the relay substrate 30.

The package substrate 40 is a multilayer substrate made of ceramic such as alumina, and is, for example, a pin grid array (PGA) substrate. As illustrated in FIG. 6, the package substrate 40 has a first surface (for example, an upper surface 42) and a second surface (for example, a bottom surface 43) located on the opposite side of the first surface.

In the package substrate 40, a plurality of wirings are provided in multiple layers in the inside located between the upper surface 42 and the bottom surface 43. These wirings are connected to a plurality of terminals (for example, the pin terminals 50) provided on the bottom surface 43 of the package substrate 40.

For example, the package substrate 40 has a substantially rectangular parallelepiped shape, and a recess 41 is formed on the upper surface 42. Then, the Peltier element 20, the relay substrate 30, and the sensor element 10 are stacked on a bottom surface 41a of the recess 41 in this order from below.

In addition, the recess 41 is provided with the stepped portion 41b at a location higher than the bottom surface 41a. Then, the bonding pad provided at the stepped portion 41b and the corresponding wiring layer of the relay substrate 30 are electrically connected by the bonding wire 34.

Further, the bonding pad provided at the stepped portion 41b is electrically connected to the pin terminal 50 provided on the bottom surface 43 of the package substrate 40 via the wiring layer (not illustrated) formed on the surface of or inside the package substrate 40. That is, the package substrate 40 has a function as a relay substrate that relays electrical connection between the relay substrate 30 and the pin terminal 50.

Since the bonding pad is formed at the stepped portion 41b in this manner, the distance between the bonding pad and the relay substrate 30 can be shortened. As a result, the length of the bonding wire 34 can be shortened, so that the wiring resistance between the package substrate 40 and the relay substrate 30 can be reduced.

Therefore, electrical properties of the sensor device 1 can be improved according to the embodiment.

Each of the bottom surface 43 and a plurality of side surfaces 44 of the package substrate 40 is substantially flat. As illustrated in FIG. 7, the plurality of pin terminals 50 are arranged side by side in a matrix on the bottom surface 43 of the package substrate 40, and a bottom heat dissipation area 43a that is flat is provided in a region where the plurality of pin terminals 50 are not arranged.

In addition, side heat dissipation areas 44a, which are flat, are provided respectively on the plurality of side surfaces 44 of the package substrate 40 as illustrated in FIG. 6.

The pin terminal 50 is made of a conductive material (for example, metal) and has a substantially cylindrical shape. Then, one end of the pin terminal 50 is electrically and mechanically connected to the wiring layer exposed from the bottom surface 43 of the package substrate 40, and the pin terminal 50 extends downward from the bottom surface 43.

In the embodiment, when the plurality of pin terminals 50 are electrically connected to an external device (not illustrated), power, a control signal, and the like are input from the external device to the sensor device 1, and an electrical signal from the sensor element 10 is output to the external device.

Note that power supply is performed from the external device to the electrode 24 of the Peltier element 20 through a terminal 45 provided on the bottom surface 41a of the recess 41 in the package substrate 40 and a bonding wire 25 connected to the terminal 45.

The window member 60 is provided to face the light receiving surface 10a (that is, the effective pixel region 11) of the sensor element 10, and is made of borosilicate glass which is a translucent material. In the sensor device 1 according to the embodiment, the light transmitted through the window member 60 is received by the effective pixel region 11 of the sensor element 10.

The support member 70 is arranged between the sensor element 10 and the window member 60, and supports the window member 60. The support member 70 has an opening 71 and a frame 72. The opening 71 is formed to face the light receiving surface 10a (that is, the effective pixel region 11) of the sensor element 10, and allows incident light to pass therethrough. The frame 72 has a frame shape, is arranged so as to surround the opening 71, and supports the window member 60.

Then, the window member 60 is attached to the support member 70 so as to cover the opening 71, thereby being supported by the support member 70. The window member 60 and the support member 70 are joined to each other without a gap using low-melting-point glass or the like.

In addition, the support member 70 is joined to the upper surface 42 of the package substrate 40 so as to cover the recess 41 of the package substrate 40. The support member 70 and the package substrate 40 are joined without a gap using an existing method.

Since the window member 60 and the support member 70 are joined without a gap, and the support member 70 and the package substrate 40 are joined without a gap in this manner, the inside of the recess 41 of the package substrate 40 can be hermetically sealed in the sensor device 1.

Note that, in a case of hermetically sealing the inside of the recess 41 of the package substrate 40, it is preferable to perform the hermetical sealing such that the inside of the recess 41 is in a low-humidity state. In addition, the support member 70 can be made of various materials such as a metal material and a ceramic material.

In the sensor device 1 according to the embodiment described above, detection sensitivity of the sensor device 1 can be improved by forming the window member 60 using the borosilicate glass.

Figure 11:
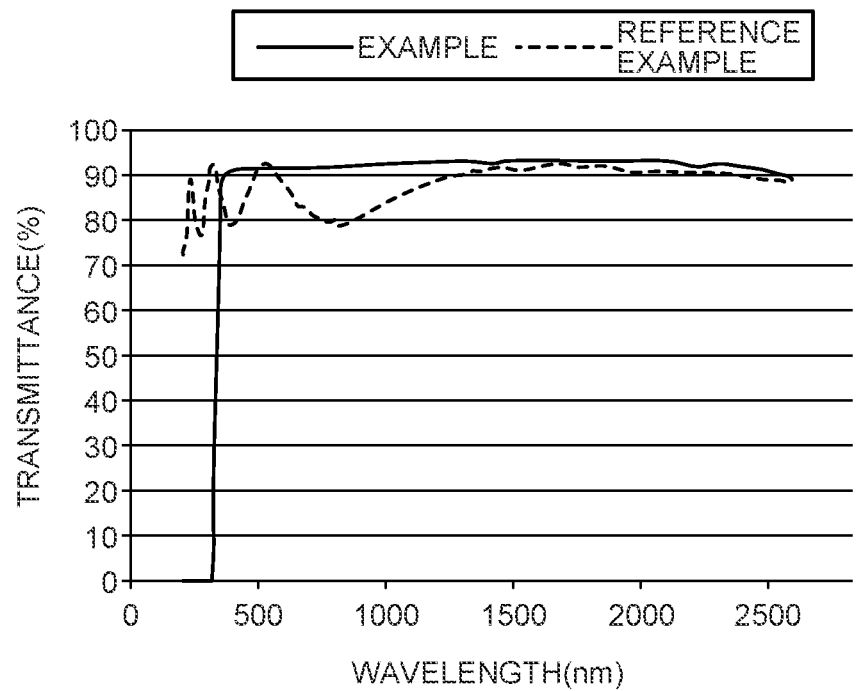
FIG. 11 is a view illustrating wavelength dependency of transmittance of window members according to Example and Reference Example.

FIG. 11 is a view illustrating wavelength dependency of transmittance of window members 60 according to Example and Reference Example. FIG. 11 illustrates a transmittance of the window member 60 made of borosilicate glass as Example, and illustrates a transmittance of the window member 60 made of sapphire glass as Reference Example.

As illustrated in FIG. 11, in the window member 60 of Reference Example, there is a region where the transmittance decreases in a visible region and a short wave infrared region (for example, the wavelength of 400 nm to 2500 nm). On the other hand, in the window member 60 of Example, the transmittance shows a stable high value in the entire visible region and short wave infrared region.

Since the window member 60 is made of the borosilicate glass whose transmittance shows a stable high value in the entire visible region and short wave infrared region in this manner, it is possible to increase the amount of received light in the sensor element 10 in the entire visible region and short wave infrared region.

Therefore, the detection sensitivity of the sensor device 1 can be improved according to the embodiment.

In addition, the window member 60 is made of borosilicate glass that is crystal-isotropic in the embodiment, so that it is possible to suppress optical properties (for example, transmittance) from being affected by an axial direction of crystal. Therefore, it is possible to achieve the sensor device 1 with a small variation in the optical properties according to the embodiment.

In addition, in the embodiment, the window member 60 is made of borosilicate glass having a small thermal expansion coefficient and high toughness, so that thermal shock properties of the sensor device 1 can be improved.

In addition, in the embodiment, the window member 60 is made of borosilicate glass which is relatively easily processed, so that processing cost of the sensor device 1 can be reduced.

In addition, in the embodiment, the support member 70 that includes the opening 71 and the frame 72 and supports the window member 60 is preferably provided in the sensor device 1. As a result, as compared with a case where the window member 60 is directly joined to the upper surface 42 of the package substrate 40, the area of the window member 60 that is relatively easily broken can be reduced, and thus, it is possible to suppress a defect of the sensor device 1 due to a breakage of the window member 60.

Therefore, reliability of the sensor device 1 can be improved according to the embodiment.

In addition, in the embodiment, the frame 72 may be arranged outside the effective pixel region 11 in a plan view, and the area of the opening 71 may be larger than the area of the effective pixel region 11. For example, in the embodiment, an opening angle of the opening 71 with respect to the effective pixel region 11 is preferably 30° or more.

As a result, light from a detection target of the sensor device 1 can be guided to the effective pixel region 11 without being blocked by the support member 70. Therefore, the detection target can be stably detected according to the embodiment.

In addition, in the embodiment, the window member 60 is preferably arranged to cover the opening 71. That is, in the embodiment, the area of the window member 60 is preferably larger than the area of the opening 71. As a result, a margin portion between the window member 60 and the support member 70 can be increased, so that it is possible to suppress generation of a gap between the window member 60 and the support member 70.

Therefore, according to the embodiment, it is possible to stably perform the hermetical sealing of the inside of the recess 41 of the package substrate 40. Note that the window member 60 according to the embodiment is not limited to the case of being arranged so as to cover the opening 71, but the window member 60 having a size substantially equal to that of the opening 71 may be arranged to be fitted into the opening 71.

In addition, the sensor element 10 is thermally connected to the cooling surface 21a of the Peltier element 20 in the embodiment. Thus, the sensor element 10 can be stably operated even in the case of using the sensor element 10 that generates high heat during the operation such as the SWIR image sensor.

In addition, in the embodiment, the cooling surface 21a of the Peltier element 20 is preferably larger than the surface opposite to the light receiving surface 10a of the sensor element 10 as illustrated in FIG. 6. That is, the cooling surface 21a of the Peltier element 20 is preferably larger than the sensor element 10 in a plan view.

As a result, the entire sensor element 10 can be uniformly cooled by the Peltier element 20, so that the sensor element 10 can be more stably operated.

Figure 12:
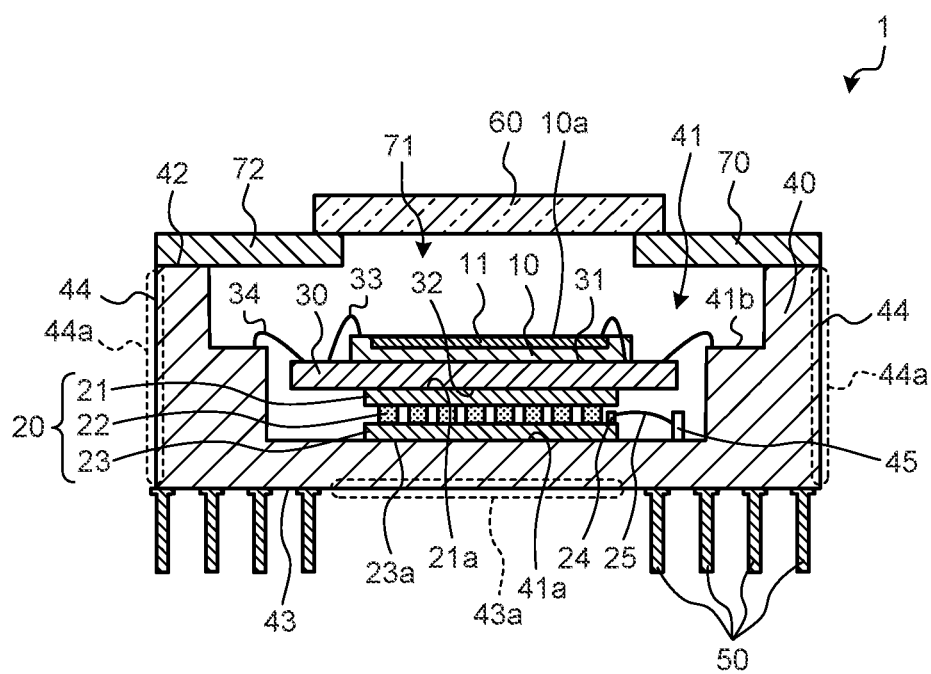
FIG. 12 is a cross-sectional view illustrating a configuration example of a sensor device according to a first modification of the embodiment of the present disclosure.

Note that the example of FIG. 6 illustrates the case where the cooling surface 21a of the Peltier element 20 is larger than the sensor element 10 in a plan view. However, the cooling surface 21a of the Peltier element 20 may have a size substantially equal to that of the sensor element 10, or the cooling surface 21a of the Peltier element 20 may be smaller than the sensor element 10 as illustrated in FIG. 12. FIG. 12 is a cross-sectional view illustrating a configuration example of the sensor device 1 according to a first modification of the embodiment of the present disclosure.

As illustrated in FIG. 12, in a plan view, the recess 41 can be made small by making the cooling surface 21a of the Peltier element 20 smaller than the sensor element 10, so that the sensor device 1 can be downsized.

In addition, in the embodiment, it is preferable that the bottom surface 41a of the recess 41 in the package substrate 40 be thermally connected to the heat dissipation surface 23a of the Peltier element 20 in the package substrate 40 accommodating the sensor element 10 and the Peltier element 20.

As a result, the heat generated in the sensor element 10 can be efficiently dissipated to the outside via the Peltier element 20 and the package substrate 40 in the sensor device 1 that hermetically seals the Peltier element 20 and the sensor element 10.

In addition, the Peltier element 20 and the sensor element 10 are hermetically sealed in the low-humidity state in the embodiment, so that it is possible to suppress dew condensation from occurring on the cooling surface 21a when the cooling surface 21a of the Peltier element 20 is cooled.

In addition, the package substrate 40 is made of ceramic in the embodiment, so that the sensor element 10 of the sensor device 1 can have multiple pixels. The reason for this will be described hereinafter.

Figure 13:
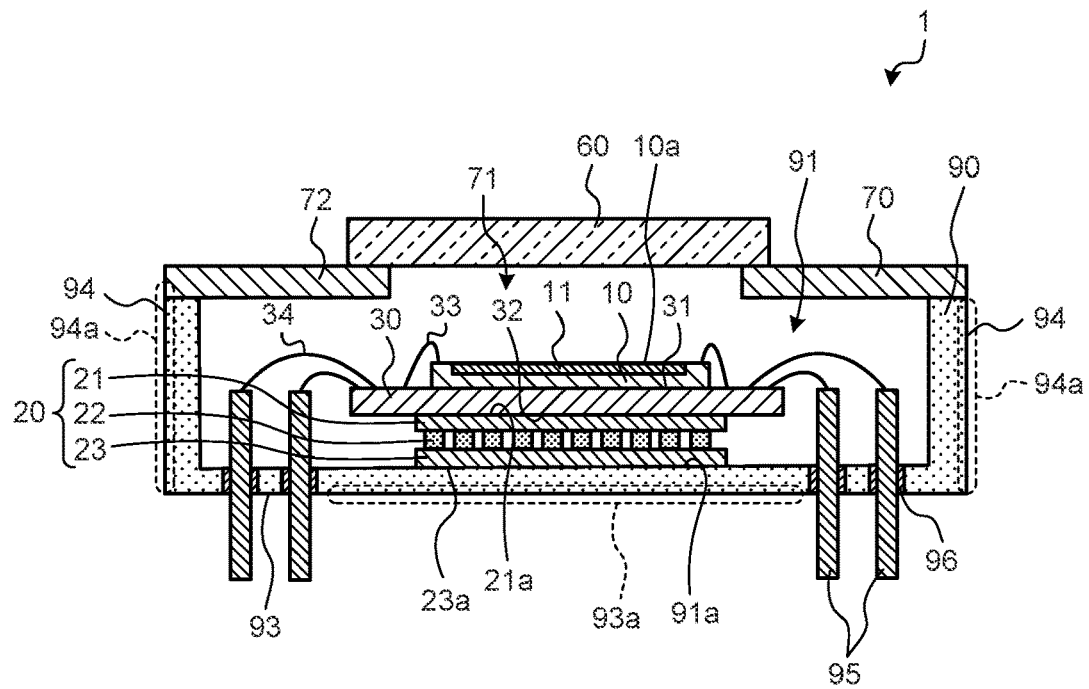
FIG. 13 is a cross-sectional view illustrating a configuration example of a sensor device according to a second modification of the embodiment of the present disclosure.

FIG. 13 is a cross-sectional view illustrating a configuration example of the sensor device 1 according to a second modification of the embodiment of the present disclosure, and illustrates the sensor device 1 including a package substrate 90 made of metal. As illustrated in FIG. 13, the sensor element 10, the Peltier element 20, and the relay substrate 30 are accommodated in a recess 91 of the package substrate 90 made of metal in the sensor device 1 of the second modification.

In addition, a plurality of pin terminals 95 each having a columnar shape are provided on a bottom surface 91a of the recess 91. Note that an insulating seal member 96 is provided between the pin terminals 95 and the package substrate 90 in order to ensure insulation between the pin terminals 95.

In addition, one end of the pin terminal 95 protrudes downward from a bottom surface 93 of the package substrate 90, and the other end of the pin terminal 95 is electrically connected to the relay substrate 30 by the bonding wire 34 in the recess 91.

Here, in the example of FIG. 13, the package substrate 90 is made of a conductive metal material, and thus, it is necessary to ensure the insulation of each of the pin terminals 95 with the seal member 96. That is, in the example of FIG. 13, a space for providing the seal member 96 is required, and thus, it is difficult to shorten the distance between the adjacent pin terminals 95, so that it is difficult to arrange the plurality of pin terminals 95 on the package substrate 90 at a high density.

On the other hand, in the example of FIG. 6, the package substrate 40 is made of insulating ceramic, so that it is unnecessary to separately provide a member for securing the insulating property. Therefore, in the example of FIG. 6, the distance between the adjacent pin terminals 50 can be shortened since the package substrate 40 is made of ceramic.

Further, the wiring layer can be three-dimensionally provided inside the package substrate 40 in the package substrate 40 made of ceramic, and thus, wiring can be individually performed on all the pin terminals 50 even when a large number of the pin terminals 50 are arranged on the bottom surface 43.

That is, signals output from all the pixels can be sent to the corresponding pin terminals 50 even when the sensor element 10 has multiple pixels in the embodiment. Therefore, the pixels of the sensor element 10 of the sensor device 1 can be increased according to the embodiment.

Note that even when the package substrate 90 of the sensor device 1 is made of metal as illustrated in FIG. 13, the detection sensitivity of the sensor device 1 can be improved by making the window member 60 using borosilicate glass.

In addition, the plurality of pin terminals 50 and the Peltier element 20 are preferably provided at different positions in a plan view in the embodiment as illustrated in FIG. 7. As a result, a heat dissipation device (not illustrated) can be directly attached to a position (that is, immediately below the Peltier element 20) corresponding to the Peltier element 20 on the bottom surface 43.

That is, the heat transferred from the heat dissipation surface 23a of the Peltier element 20 to the bottom surface 43 of the package substrate 40 can be dissipated by the heat dissipation device without being hindered by the pin terminal 50 in the embodiment. Therefore, the heat dissipation of the sensor device 1 can be improved according to the embodiment.

In addition, a bottom heat dissipation area 43a that is wider and flatter than the Peltier element 20 is preferably provided at a position corresponding to the Peltier element 20 on the bottom surface 43 of the package substrate 40 in the embodiment as illustrated in FIG. 7.

As a result, the heat dissipation device having a larger area than the Peltier element 20 can be provided in the bottom heat dissipation area 43a, so that the heat dissipation of the sensor device 1 can be further improved.

In addition, the plurality of pin terminals 50 may be provided along two sides of the bottom surface 43, which face each other, in the embodiment as illustrated in FIG. 7. As a result, the heat dissipation device can be arranged so as to protrude from the package substrate 40, so that the heat dissipation of the sensor device 1 can be further improved.

Figure 14:
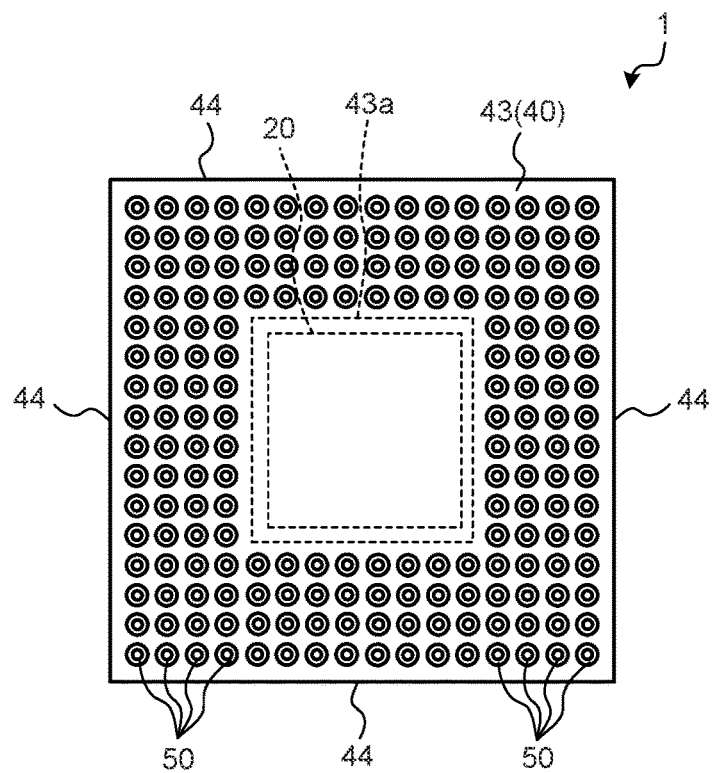
FIG. 14 is a bottom view illustrating a configuration example of a sensor device according to a third modification of the embodiment of the present disclosure.

Note that the bottom heat dissipation area 43a is not limited to the case of being wider than the Peltier element 20, and may have a size substantially equal to that of the Peltier element 20 as illustrated in FIG. 14. FIG. 14 is a bottom view illustrating a configuration example of the sensor device 1 according to a third modification of the embodiment of the present disclosure.

As illustrated in FIG. 14, even if the bottom heat dissipation area 43a has a size substantially equal to that of the Peltier element 20, the bottom heat dissipation area 43a is arranged so as to overlap the Peltier element 20, so that the heat from the Peltier element 20 can be dissipated without any trouble by the heat dissipation device.

In addition, the plurality of pin terminals 50 may also be provided so as to surround the Peltier element 20 in a plan view in the embodiment as illustrated in FIG. 14. As a result, the multiple pin terminals 50 can be provided on the package substrate 40, so that the heat dissipation device can be arranged to protrude from the package substrate 40. Therefore, the pixels of the sensor element 10 of the sensor device 1 can be further increased according to the example of FIG. 14.

In addition, a side heat dissipation area 44a that is flat may be provided on a side surface 44 of the package substrate 40 in the embodiment as illustrated in FIG. 6. As a result, the heat dissipation device (not illustrated) can be provided in the side heat dissipation area 44a, so that the heat dissipation of the sensor device 1 can be further improved.

Note that the example in which the bottom heat dissipation area 43a and the side heat dissipation area 44a, which are flat, are provided on the bottom surface 43 and the side surface 44 of the package substrate 40 has been described in the embodiment, but the bottom heat dissipation area 43a and the side heat dissipation area 44a are not limited to the case of being flat.

For example, when irregularities are provided in the bottom heat dissipation area 43a and the side heat dissipation area 44a, it is possible to increase the surface area of the bottom heat dissipation area 43a and the side heat dissipation area 44a, so that it is possible to improve the heat dissipation of the sensor device 1 without separately providing the heat dissipation device.

In addition, the relay substrate 30 that relays the electrical connection between the package substrate 40 and the sensor element 10 is preferably provided in the embodiment. As a result, the thickness of the wiring between the package substrate 40 and the sensor element 10 can be made thicker than the bonding wires 33 and 34, so that the wiring resistance between the package substrate 40 and the sensor element 10 can be reduced.

Therefore, electrical properties of the sensor device 1 can be improved according to the embodiment. In addition, it is possible to make the sensor device 1 multifunctional by mounting various mounting components (for example, a capacitor, a resistor, and the like) on the relay substrate 30 in the embodiment.

In addition, the sensor element 10 is preferably an SWIR image sensor in the embodiment. As a result, sensing that utilizes light having a longer wavelength than visible light can be performed by the sensor device 1.

Note that the sensor element 10 according to the embodiment is not limited to the SWIR image sensor. For example, the sensor element 10 according to the embodiment may be a complementary metal oxide semiconductor (CMOS) image sensor, a charge coupled device (CCD) image sensor, or the like having pixels each of which converts light in a visible region into an electrical signal.

Next, a case where the sensor element according to the embodiment is a CMOS image sensor having pixels each of which converts light in a visible region into an electrical signal will be described with reference to FIGS. 15A to 17.

Figure 15A:
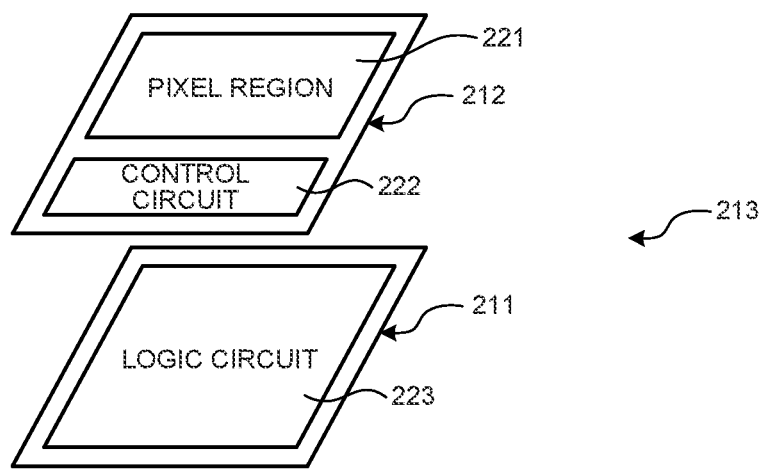
FIG. 15A is a view illustrating a substrate configuration of a sensor element of another example according to the embodiment of the present disclosure.
Figure 15B:
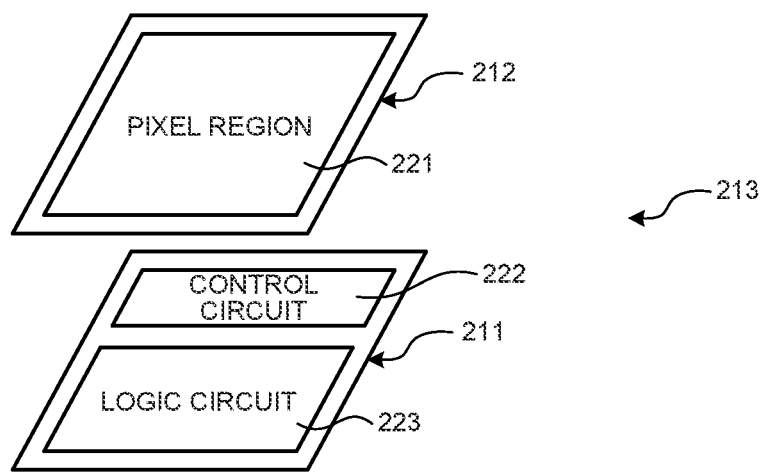
FIG. 15B is a view illustrating a substrate configuration of the sensor element of the another example according to the embodiment of the present disclosure.

FIGS. 15A and 15B are views illustrating a substrate configuration of a sensor element 10A of another example according to the embodiment of the present disclosure. The sensor element 10A (see FIG. 16) is a semiconductor package in which a stacked substrate 213 formed by stacking a lower substrate 211 and an upper substrate 212 is packaged.

The upper substrate 212 has a color filter (not illustrated) of red (R), green (G), or blue (B) and an on-chip lens (not illustrated) formed on an upper surface thereof. In addition, the upper substrate 212 is connected in a cavity-less structure via a glass protection substrate (not illustrated) configured to protect the on-chip lens and a glass seal resin (not illustrated).

For example, a pixel region 221 in which pixel units that perform photoelectric conversion are two-dimensionally arrayed, and a control circuit 222 that controls the pixel units are formed on the upper substrate 212 as illustrated in FIG. 15A. In addition, a logic circuit 223 such as a signal processing circuit that processes a pixel signal output from the pixel unit is formed on the lower substrate 211.

Alternatively, only the pixel region 221 may be formed on the upper substrate 212, and the control circuit 222 and the logic circuit 223 may be formed on the lower substrate 211 as illustrated in FIG. 15B.

As described above, the logic circuit 223 or both the control circuit 222 and the logic circuit 223 are formed and stacked on the lower substrate 211 different from the upper substrate 212 of the pixel region 221 in the present disclosure. As a result, a size of the sensor element 10A can be reduced as compared with a case where the pixel region 221, the control circuit 222, and the logic circuit 223 are arranged in the planar direction on one semiconductor substrate.

Hereinafter, the upper substrate 212 on which at least the pixel region 221 is formed will be referred to as a pixel sensor substrate, and the lower substrate 211 on which at least the logic circuit 223 is formed will be referred to as a logic substrate.

Figure 16:
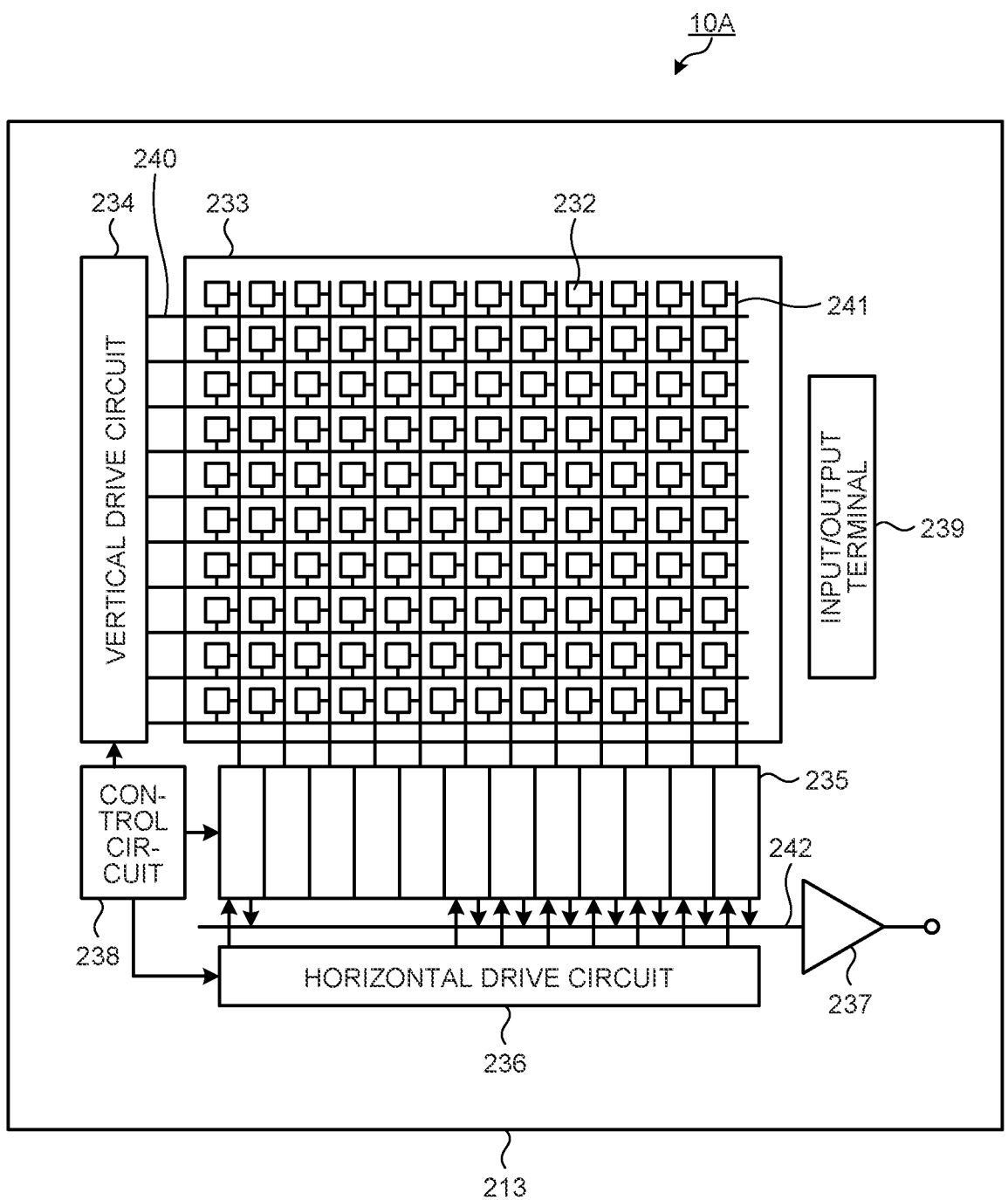
FIG. 16 is a diagram illustrating a circuit configuration example of a stacked substrate of the sensor element of the another example according to the embodiment of the present disclosure.

FIG. 16 is a diagram illustrating a circuit configuration example of the stacked substrate 213 of the sensor element 10A of the another example according to the embodiment of the present disclosure. The stacked substrate 213 includes a pixel array unit 233 in which pixels 232 are arrayed in a two-dimensional array, a vertical drive circuit 234, column signal processing circuits 235, a horizontal drive circuit 236, an output circuit 237, a control circuit 238, an input/output terminal 239, and the like.

The pixel 232 includes a photodiode as a photoelectric conversion element and a plurality of pixel transistors. A circuit configuration example of the pixel 232 will be described later with reference to FIG. 17.

In addition, the pixel 232 can also have a shared pixel structure. Such a pixel sharing structure includes a plurality of photodiodes, a plurality of transfer transistors, one shared floating diffusion (floating diffusion region), and each shared one of other pixel transistors. That is, in the shared pixels, photodiodes and transfer transistors constituting a plurality of unit pixels are configured to share each one of other pixel transistor.

The control circuit 238 receives an input clock and data giving an instruction on an operation mode and the like, and outputs data such as internal information of the stacked substrate 213. That is, the control circuit 238 generates a clock signal and a control signal serving as references of operations of the vertical drive circuit 234, the column signal processing circuit 235, the horizontal drive circuit 236, and the like based on a vertical synchronization signal, a horizontal synchronization signal, and a master clock.

Then, the control circuit 238 outputs the generated clock signal and control signal to the vertical drive circuit 234, the column signal processing circuit 235, the horizontal drive circuit 236, and the like.

The vertical drive circuit 234 includes, for example, a shift register, selects a predetermined pixel driving wiring 240, supplies a pulse for driving the pixel 232 to the selected pixel driving wiring 240, and drives the pixels 232 in units of rows.

That is, the vertical drive circuit 234 selectively scans the pixels 232 in the pixel array unit 233 sequentially in the vertical direction in units of rows. Then, the vertical drive circuit 234 supplies a pixel signal based on a signal charge generated according to the amount of received light in the photoelectric conversion unit of each of the pixels 232 to the column signal processing circuit 235 through a vertical signal line 241.

The column signal processing circuit 235 is arranged for each column of the pixels 232, and performs signal processing such as noise removal on signals output from the pixels 232 of one row for each pixel column. For example, the column signal processing circuit 235 performs signal processing such as CDS and AD conversion to remove fixed pattern noise unique to each pixel.

The horizontal drive circuit 236 includes, for example, a shift register, and sequentially outputs horizontal scanning pulses to sequentially select each of the column signal processing circuits 235 such that a pixel signal is output from each of the column signal processing circuits 235 to a horizontal signal line 242.

The output circuit 237 performs signal processing on the signals sequentially supplied from the column signal processing circuits 235, respectively, through the horizontal signal line 242, and outputs the processed signals. For example, the output circuit 237 may perform only buffering, or may perform black level adjustment, column variation correction, various types of digital signal processing, and the like. The input/output terminal 239 exchanges signals with the outside.

The stacked substrate 213 configured as described above is a CMOS image sensor called a column AD system in which the column signal processing circuit 235 that performs CDS processing and AD conversion processing is arranged for each pixel column.

Figure 17:
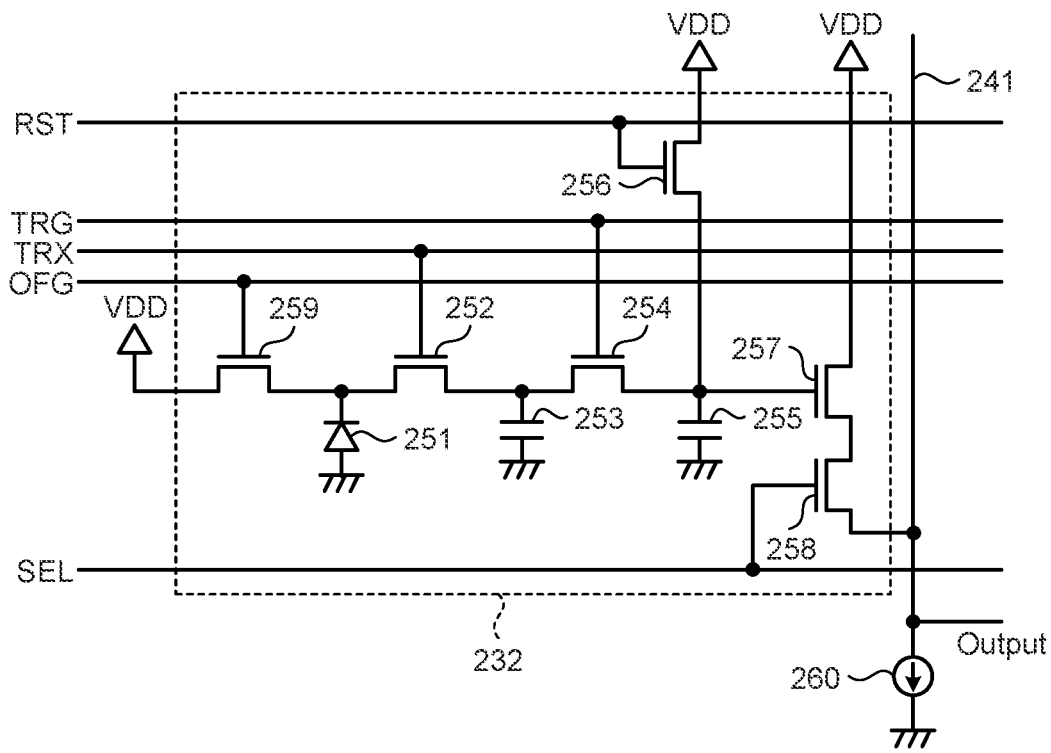
FIG. 17 is a diagram illustrating an equivalent circuit of a pixel of the sensor element of the another example according to the embodiment of the present disclosure.

FIG. 17 is a diagram illustrating an equivalent circuit of the pixel 232 of the sensor element 10A of the another example according to the embodiment of the present disclosure. The pixel 232 illustrated in FIG. 17 illustrates a configuration that implements an electronic global shutter function.

The pixel 232 includes a photodiode 251, a first transfer transistor 252, a memory unit 253, a second transfer transistor 254, an FD 255, a reset transistor 256, an amplification transistor 257, a selection transistor 258, and a discharge transistor 259. Note that the photodiode 251 is an example of the photoelectric conversion element, and the FD 255 is the floating diffusion region.

The photodiode 251 is a photoelectric conversion unit that generates and accumulates a charge (signal charge) corresponding to the amount of received light. The photodiode 251 has an anode terminal being grounded, and a cathode terminal being connected to the memory unit 253 via the first transfer transistor 252. In addition, the cathode terminal of the photodiode 251 is also connected to the discharge transistor 259 configured to discharge an unnecessary charge.

When turned on by the transfer signal TRX, the first transfer transistor 252 reads out a charge generated by the photodiode 251 and transfers the charge to the memory unit 253. The memory unit 253 is a charge holding unit that temporarily holds a charge until the charge is transferred to the FD 255.

When turned on by a transfer signal TRG, the second transfer transistor 254 reads out the charge held in the memory unit 253 and transfers the charge to the FD 255.

The FD 255 is a charge holding unit that holds the charge read out from the memory unit 253 in order to read out the charge as a signal. When turned on by the reset signal RST, the reset transistor 256 resets a potential of the FD 255 as the charge accumulated in the FD 255 is discharged to a constant voltage source VDD.

The amplification transistor 257 outputs a pixel signal corresponding to the potential of the FD 255. That is, the amplification transistor 257 forms a source follower circuit with a load MOS 260 as a constant current source.

Then, a pixel signal indicating a level corresponding to the charge accumulated in the FD 255 is output from the amplification transistor 257 to the column signal processing circuit 235 (see FIG. 16) via the selection transistor 258. The load MOS 260 is arranged, for example, in the column signal processing circuit 235.

The selection transistor 258 is turned on when the pixel 232 is selected by a selection signal SEL, and outputs the pixel signal of the pixel 232 to the column signal processing circuit 235 via the vertical signal line 241.

When turned on by a discharge signal OFG, the discharge transistor 259 discharges the unnecessary charge accumulated in the photodiode 251 to the constant voltage source VDD. The transfer signals TRX and TRG, the reset signal RST, the discharge signal OFG, and the selection signal SEL are supplied from the vertical drive circuit 234 via the pixel driving wiring 240.

Next, an operation of the pixel 232 will be briefly described. First, before exposure is started, the discharge transistor 259 is turned on by supplying the discharge signal OFG at a high level to the discharge transistor 259, a charge accumulated in the photodiode 251 is discharged to the constant voltage source VDD, and the photodiodes 251 of all the pixels are reset.

After the photodiodes 251 are reset, when the discharge transistor 259 is turned off by the discharge signal OFG at a low level, the exposure is started in all the pixels of the pixel array unit 233.

When a predetermined exposure time has elapsed, the first transfer transistor 252 is turned on by the transfer signal TRX in all the pixels of the pixel array unit 233, and the charge accumulated in the photodiode 251 is transferred to the memory unit 253.

After the first transfer transistor 252 is turned off, the charges held in the memory units 253 of the respective pixels 232 are sequentially read out to the column signal processing circuits 235 in units of rows. In the read-out operation, the second transfer transistor 254 of the pixel 232 of the read row is turned on by the transfer signal TRG, and the charge held in the memory unit 253 is transferred to the FD 255.

Then, when the selection transistor 258 is turned on by the selection signal SEL, a signal indicating a level corresponding to the charge accumulated in the FD 255 is output from the amplification transistor 257 to the column signal processing circuit 235 via the selection transistor 258.

As described above, in the example of FIG. 17, it is possible to perform the operation (imaging) of a global shutter system in which the exposure time is set to be the same for all the pixels of the pixel array unit 233, the charges are temporarily held in the memory units 253 after the end of the exposure, and the charges are sequentially read out from the memory units 253 in units of rows.

Note that the circuit configuration of the pixel 232 is not limited to the configuration illustrated in FIG. 17, and for example, a circuit configuration that does not include the memory unit 253 and performs an operation by a so-called rolling shutter system can also be adopted.

[Other Modifications]

Figure 18:
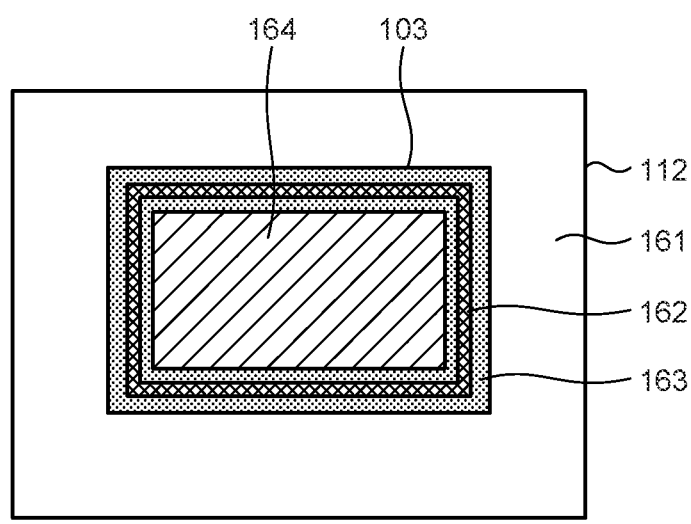
FIG. 18 is a plan view of a pixel array region illustrating a pixel arrangement of a charge emitting pixel according to a fourth modification.

Next, other modifications according to the embodiment will be described with reference to FIGS. 18 to 25. FIG. 18 is a plan view of a pixel array region 103 illustrating a pixel arrangement of a charge emitting pixel according to a fourth modification.

In the fourth modification, an optical black (OPB) region that detects a black level serving as a reference is formed as a part of the pixel array region 103. A pixel structure of the fourth modification is a pixel structure in a case where the OPB region is formed as a part of the pixel array region 103.

In the case where a OPB region 163 is formed as a part of the pixel array region 103, the OPB region 163 includes a plurality of columns and a plurality of rows that are on the outermost side of each side of the pixel array region 103 having a rectangular shape as illustrated in FIG. 18. Then, the innermost one row and one column in the OPB region 163 are set as the charge emission region 162.

A region inside the OPB region 163 of the pixel array region 103 is an effective pixel region in which the ordinary pixel 102A (see FIG. 19) that outputs a pixel signal corresponding to the amount of received light is arranged.

Figure 19:
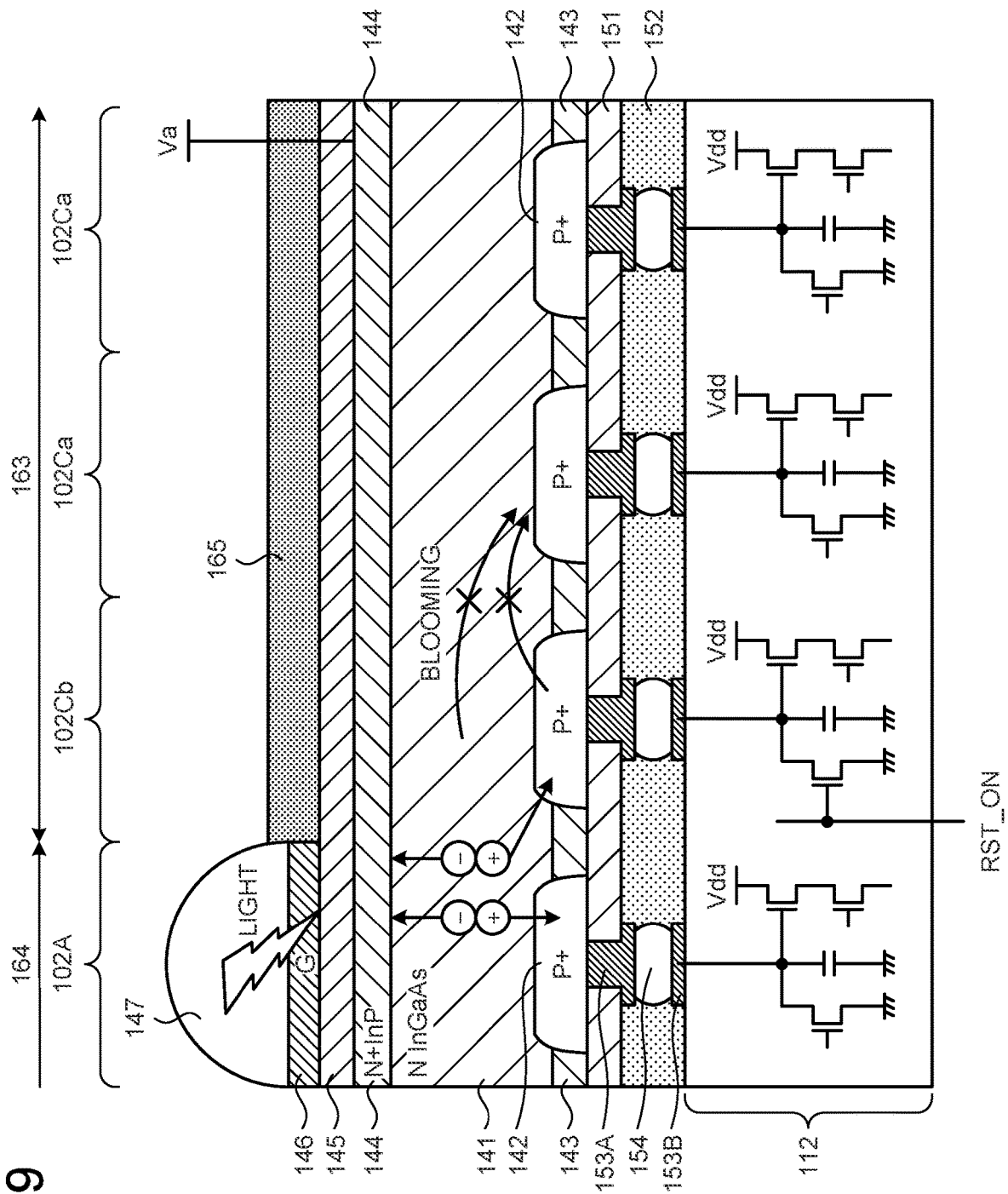
FIG. 19 is a cross-sectional view illustrating a structure of a pixel according to the fourth modification of the embodiment of the present disclosure.

FIG. 19 is a cross-sectional view illustrating a structure of the pixel 102 according to the fourth modification of the embodiment of the present disclosure. As illustrated in FIG. 19, OPB pixels 102C (102Ca and 102Cb) are arranged in the OPB region 163.

The OPB pixel 102C has a light shielding film 165 formed on the upper side of the N-type semiconductor thin film 141 as the photoelectric conversion unit 121, instead of the color filter 146 and the on-chip lens 147. The light shielding film 165 is made of, for example, a metal material such as tungsten, aluminum, and gold.

In the OPB region 163, for example, three OPB pixels 102C forming three rows or three columns are arranged side by side. Then, the innermost OPB pixel 102C (close to the center of the pixel array region 103) among them is the OPB pixel 102Cb for charge emission that is controlled such that the reset transistor 123 is always turned on similarly to the above-described embodiment.

On the other hand, the two OPB pixels 102C on the outer side in the OPB region 163 in which the three OPB pixels 102C forming three rows or three columns are arranged side by side are OPB pixels 102Ca for black level read-out that is subjected to black level read-out control. Other configurations in the fourth modification are similar to those of the above-described embodiment.

For example, when the pixel array region 103 of the sensor element 10 is irradiated with high-illuminance light, blooming sometimes occurs in the ordinary pixel 102A most adjacent to the OPB region 163. Then, in this case, there is a possibility that the adjacent OPB pixel 102C, that is, the OPB pixel 102C on the innermost side in the OPB region 163 is affected.

In addition, there is a possibility that light incident on the ordinary pixel 102A most adjacent to the OPB region 163 leaks into the adjacent OPB pixel 102C so that blooming occurs in the adjacent OPB pixel 102C.

Therefore, in the fourth modification, the OPB pixel 102C on the innermost side in the OPB region 163 is set as the OPB pixel 102Cb for charge emission that is controlled such that the reset transistor 123 is always turned on.

As a result, the occurrence of blooming can be prevented by the OPB pixel 102Cb for charge emission, and the charge can be prevented from flowing into the adjacent OPB pixel 102Ca for black level read-out. Therefore, it is possible to suppress image quality deterioration caused by the occurrence of blooming according to the fourth modification.

Figure 20:
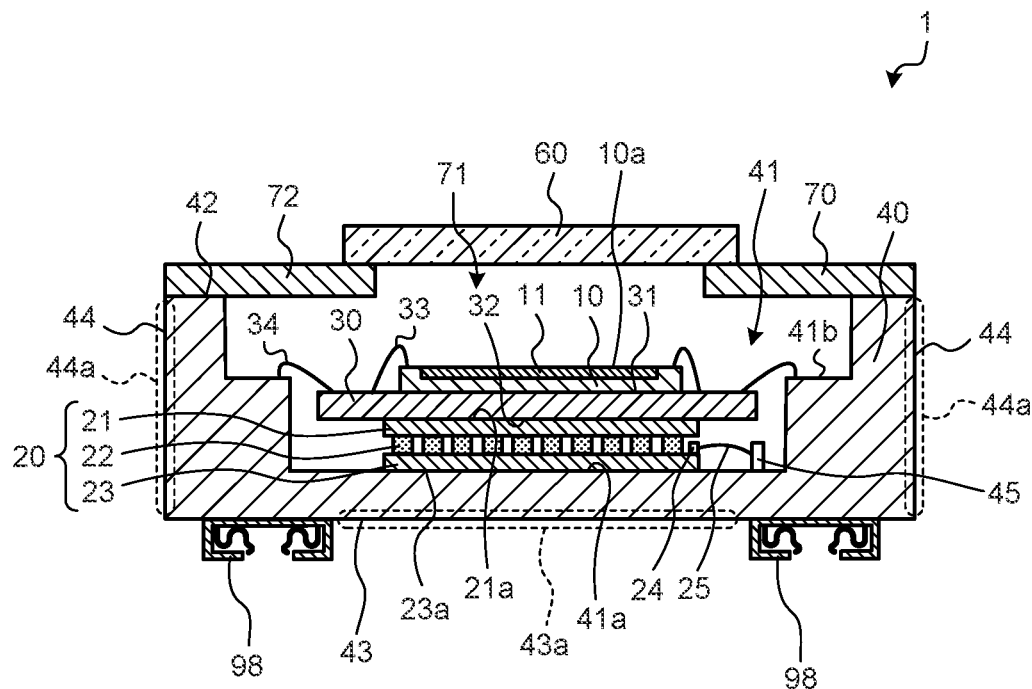
FIG. 20 is a cross-sectional view illustrating a configuration example of a sensor device according to a fifth modification of the embodiment of the present disclosure.

In addition, the example in which the external terminal of the sensor device 1 is the pin terminal 50 has been described in the above-described embodiment, but the external terminal of the sensor device 1 is not limited to the pin terminal 50. FIG. 20 is a cross-sectional view illustrating a configuration example of the sensor device 1 according to a fifth modification of the embodiment of the present disclosure.

As illustrated in FIG. 20, the sensor device 1 of the fifth modification is different from that of the embodiment in that a connector 98 is provided as the external terminal instead of the pin terminal 50. The connector 98 is provided at a position different from a position (that is, immediately below the Peltier element 20) corresponding to the Peltier element 20 on the bottom surface 43, and is electrically connected to a wiring layer exposed from the bottom surface 43 of the package substrate 40.

In the fifth modification, when the connector 98 is electrically connected to an external device (not illustrated), power, a control signal, and the like are input from the external device to the sensor device 1, and an electrical signal from the sensor element 10 is output to the external device.

In the fifth modification, the external terminal is configured using the connector 98, so that the sensor device 1 can be easily attached to the external device (not illustrated). Note that, in the present disclosure, the external terminal of the sensor device 1 is not limited to the pin terminal 50 and the connector 98, and various external terminals can be adopted.

Figure 21:
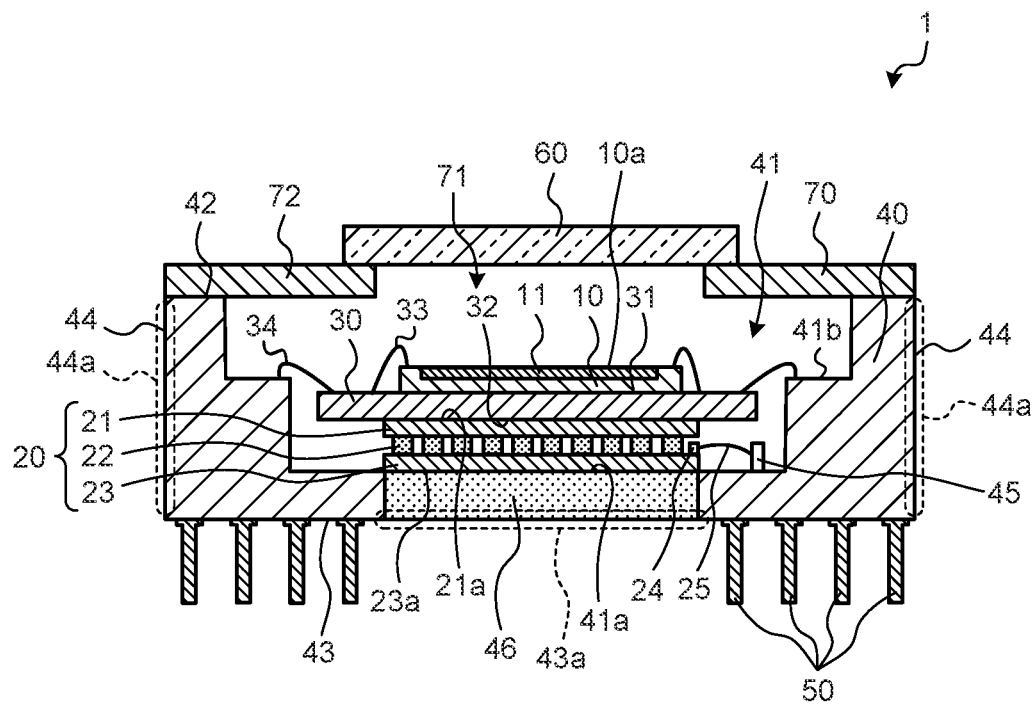
FIG. 21 is a cross-sectional view illustrating a configuration example of a sensor device according to a sixth modification of the embodiment of the present disclosure.

FIG. 21 is a cross-sectional view illustrating a configuration example of the sensor device 1 according to a sixth modification of the embodiment of the present disclosure. As illustrated in FIG. 21, in the sensor device 1 of the sixth modification, a heat dissipation member 46 made of metal is provided on at least a part of a surface (the bottom surface 41a in the present disclosure) of the package substrate 40 facing the heat dissipation surface 23a of the Peltier element 20.

That is, the heat dissipation member 46 is exposed to the bottom surface 41a in the sensor device 1 of the sixth modification. Note that an adhesive or the like may be interposed between the heat dissipation surface 23a of the Peltier element 20 and the bottom surface 41a in the sensor device 1 of the sixth modification.

The heat dissipation member 46 is made of, for example, metal having a high thermal conductivity such as copper, aluminum, and tungsten. That is, in the package substrate 40 of the sixth modification, at least a part of a heat transfer path from the heat dissipation surface 23a of the Peltier element 20 to the bottom heat dissipation area 43a is made of metal having a higher thermal conductivity than ceramic.

As a result, the heat transfer efficiency from the heat dissipation surface 23a of the Peltier element 20 to the bottom heat dissipation area 43a can be improved. Therefore, the heat dissipation of the sensor device 1 can be improved according to the sixth modification.

In addition, the heat dissipation member 46 preferably penetrates between the surface (bottom surface 41a) facing the heat dissipation surface 23a of the Peltier element 20 and the bottom surface 43 in the package substrate 40 in the sixth modification. As a result, the heat resistance from the bottom surface 41a to the bottom heat dissipation area 43a can be reduced, so that the heat dissipation of the sensor device 1 can be further improved.

In addition, the heat dissipation member 46 is preferably provided on the entire surface of the package substrate 40 facing the heat dissipation surface 23a of the Peltier element 20 in the sixth modification as illustrated in FIG. 21. As a result, the heat resistance from the bottom surface 41a to the bottom heat dissipation area 43a can be further reduced, so that the heat dissipation of the sensor device 1 can be further improved.

Figure 22:
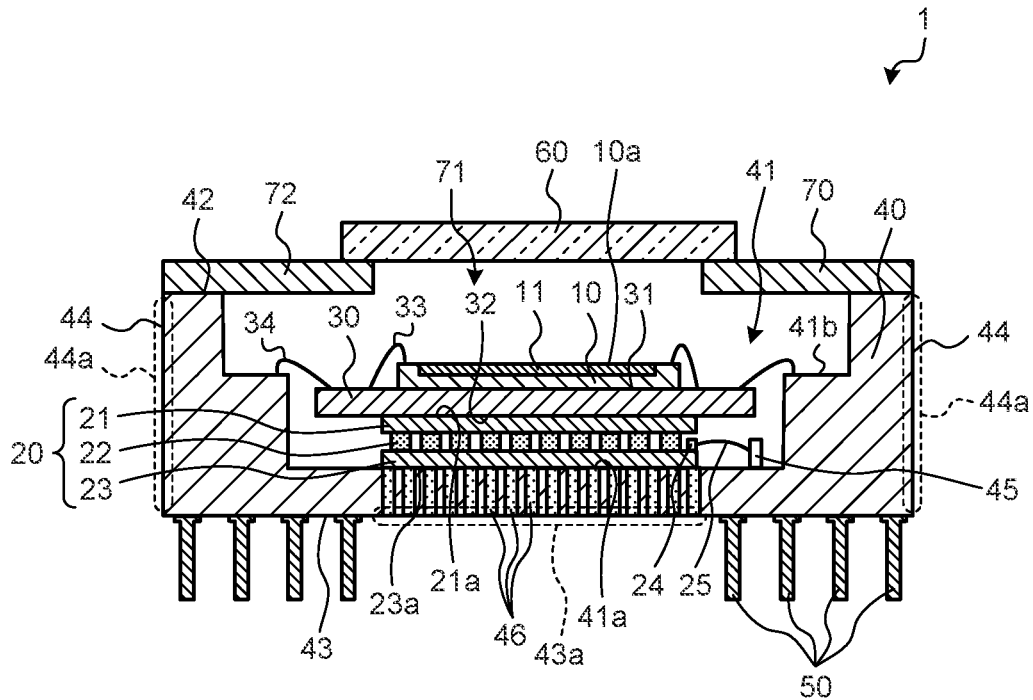
FIG. 22 is a cross-sectional view illustrating a configuration example of a sensor device according to a seventh modification of the embodiment of the present disclosure.

Note that the heat dissipation member 46 is not limited to the case of being provided on the entire surface of the package substrate 40 facing the heat dissipation surface 23a of the Peltier element 20. FIG. 22 is a cross-sectional view illustrating a configuration example of the sensor device 1 according to a seventh modification of the embodiment of the present disclosure.

As illustrated in FIG. 22, the package substrate 40 may be provided with a plurality of via-shaped heat dissipation members 46 penetrating between the surface (bottom surface 41a) facing the heat dissipation surface 23a of the Peltier element 20 and the bottom surface 43. Even in this example of FIG. 22, the heat resistance from the bottom surface 41a to the bottom heat dissipation area 43a can be reduced, so that the heat dissipation of the sensor device 1 can be further improved.

Note that the example in which the heat dissipation member 46 is made of the metal material has been described in the sixth modification and the seventh modification, but the heat dissipation member 46 is not necessarily limited to the metal material, and may be a material having a higher thermal conductivity than the ceramic forming the package substrate 40. For example, a ceramic material having a high thermal conductivity may be used as the heat dissipation member 46.

In addition, the example in which the heat dissipation member 46 is provided so as to be exposed to the surface of the package substrate 40 facing the heat dissipation surface 23a of the Peltier element 20 has been described in the sixth modification and the seventh modification, but the heat dissipation member 46 is not necessarily exposed to such a surface.

For example, the heat dissipation member 46 may be arranged so as to be buried immediately below the Peltier element 20 in the package substrate 40. That is, the heat dissipation member 46 may be arranged so as to overlap the Peltier element 20 in a plan view. As a result, the heat resistance from the bottom surface 41a to the bottom heat dissipation area 43a can be reduced, so that the heat dissipation of the sensor device 1 can be further improved.

In addition, the heat dissipation member 46 may be arranged at a location other the portion than immediately below the Peltier element 20.

Figure 23:
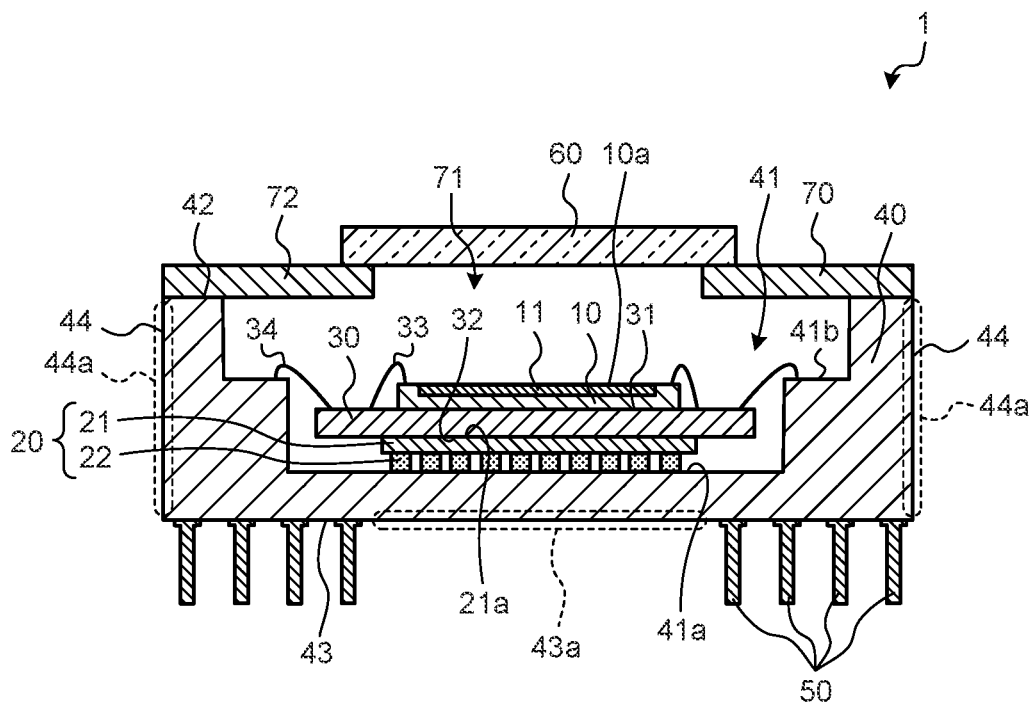
FIG. 23 is a cross-sectional view illustrating a configuration example of a sensor device according to an eighth modification of the embodiment of the present disclosure.

FIG. 23 is a cross-sectional view illustrating a configuration example of the sensor device 1 according to an eighth modification of the embodiment of the present disclosure. As illustrated in FIG. 23, the sensor device 1 of the eighth modification is different from that of the embodiment in terms of a configuration of the Peltier element 20.

Specifically, the package substrate 40 is configured integrally with the heat dissipation substrate 23 of the Peltier element 20 in the eighth modification. That is, in the eighth modification, the metal layer ML2 illustrated in FIG. 9 is provided not on the heat dissipation substrate 23 but on the bottom surface 41a of the recess 41 in the package substrate 40, and the columnar portion 22 and the cooling substrate 21 are stacked on the metal layer ML2 of the bottom surface 41a to constitute the Peltier element 20.

Since the package substrate 40 is configured integrally with the heat dissipation substrate 23 of the Peltier element 20 in this manner, it is possible to reduce the heat resistance at an interface between the heat dissipation substrate 23 and the package substrate 40. In addition, the heat dissipation substrate 23 can be omitted in the eighth modification, so that a heat transfer path from the sensor element 10 to the bottom heat dissipation area 43a can be shortened.

Therefore, the heat dissipation of the sensor device 1 can be improved according to the eighth modification.

Figure 24:
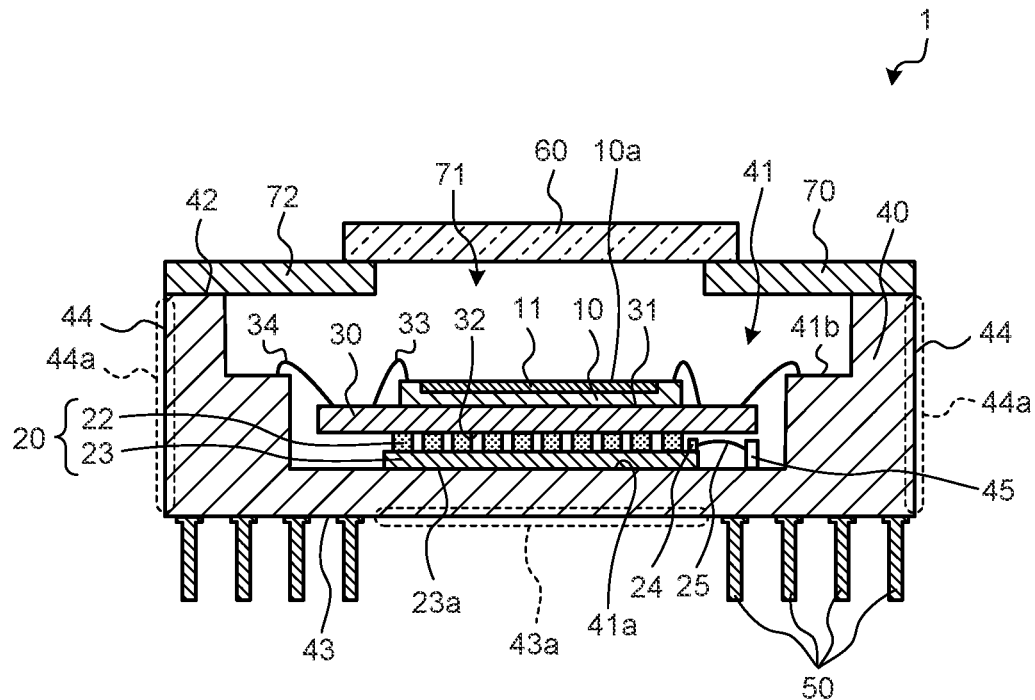
FIG. 24 is a cross-sectional view illustrating a configuration example of a sensor device according to a ninth modification of the embodiment of the present disclosure.

FIG. 24 is a cross-sectional view illustrating a configuration example of the sensor device 1 according to a ninth modification of the embodiment of the present disclosure. As illustrated in FIG. 24, the sensor device 1 of the ninth modification is different from those of the embodiment and the eighth modification in terms of a configuration of the Peltier element 20.

Specifically, the relay substrate 30 is configured integrally with the cooling substrate 21 of the Peltier element 20 in the ninth modification. That is, in the ninth modification, the metal layer ML1 illustrated in FIG. 8 is provided not on the cooling substrate 21 but on the back surface 32 of the relay substrate 30, and the relay substrate 30 is further stacked on the stacked heat dissipation substrate 23 and columnar portion 22 to constitute the Peltier element 20.

Since the relay substrate 30 is configured integrally with the cooling substrate 21 of the Peltier element 20 in this manner, it is possible to reduce the thermal resistance at an interface between the relay substrate 30 and the cooling substrate 21. In addition, the cooling substrate 21 can be omitted in the ninth modification, so that a heat transfer path from the sensor element 10 to the bottom heat dissipation area 43a can be shortened.

Therefore, the heat dissipation of the sensor device 1 can be improved according to the ninth modification.

Figure 25:
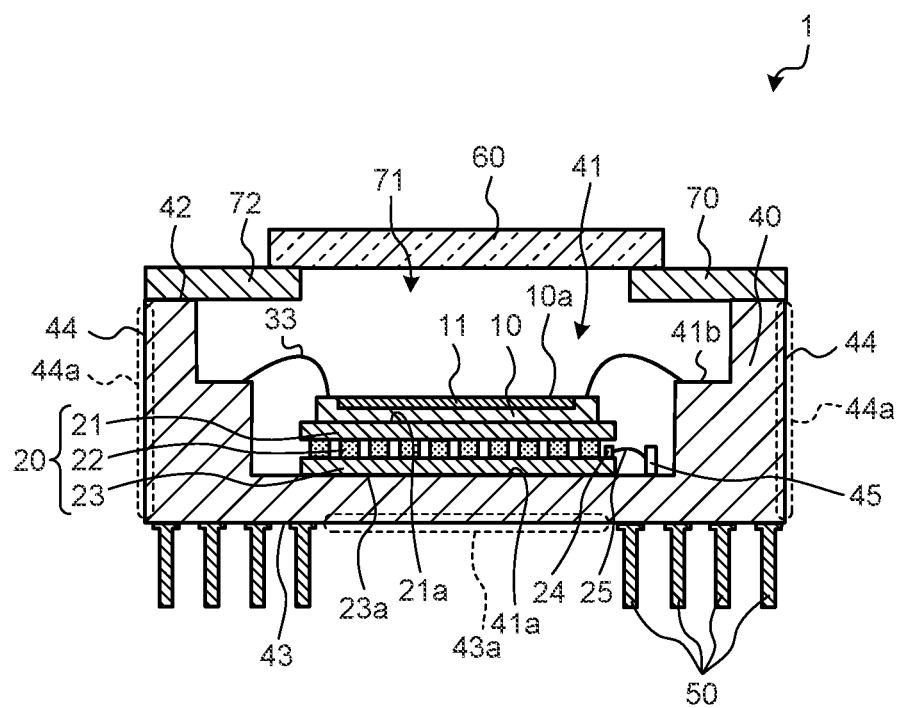
FIG. 25 is a cross-sectional view illustrating a configuration example of a sensor device according to a tenth modification of the embodiment of the present disclosure.

FIG. 25 is a cross-sectional view illustrating a configuration example of the sensor device 1 according to a tenth modification of the embodiment of the present disclosure. As illustrated in FIG. 25, the sensor device 1 of the tenth modification is different from that of the embodiment in that the relay substrate 30 is not provided.

That is, the sensor element 10 is directly joined to the cooling surface 21a of the Peltier element 20 in the tenth modification. In addition, the electrical connection between the sensor element 10 and the package substrate 40 is achieved directly by the bonding wire 33.

Since the relay substrate 30 can be omitted in the tenth modification, a heat transfer path from the sensor element 10 to the bottom heat dissipation area 43a can be shortened. Therefore, the heat dissipation of the sensor device 1 can be improved according to the tenth modification.

In addition, the recess 41 can be made small by omitting the relay substrate 30 in the tenth modification, so that the sensor device 1 can be downsized.

Effects

The sensor device 1 according to the embodiment includes the Peltier element 20, the sensor element 10 (10A) thermally connected to the cooling surface 21a of the Peltier element 20, and the window member 60 that faces the light receiving surface 10a of the sensor element 10 (10A) and is made of borosilicate glass.

As a result, the detection sensitivity of the sensor device 1 can be improved.

In addition, the effective pixel region 11, which receives incident light from the window member 60, is arranged on the light receiving surface 10a of the sensor element 10 (10A) in the sensor device 1 according to the embodiment.

As a result, the detection sensitivity of the sensor device 1 can be improved.

In addition, the sensor device 1 according to the embodiment further includes the support member 70 arranged between the sensor element 10 (10A) and the window member 60. In addition, the support member 70 includes the opening 71 that allows passage of the incident light, and the frame 72 that supports the window member 60.

As a result, the reliability of the sensor device 1 can be improved.

In addition, the frame 72 is arranged outside the effective pixel region 11 in a plan view in the sensor device 1 according to the embodiment.

As a result, a detection target can be stably detected.

In addition, the area of the opening 71 is larger than the area of the effective pixel region 11 in the sensor device 1 according to the embodiment.

As a result, a detection target can be stably detected.

In addition, the window member 60 is arranged to cover the opening 71 in the sensor device 1 according to the embodiment.

As a result, it is possible to stably perform the hermetical sealing of the inside of the recess 41 of the package substrate 40.

In addition, the cooling surface 21*a* of the Peltier element 20 is larger than the surface of the sensor element 10 (10A) opposite to the light receiving surface 10*a* in the sensor device 1 according to the embodiment.

As a result, the entire sensor element 10 (10A) can be uniformly cooled by the Peltier element 20, so that the sensor element 10 (10A) can be more stably operated.

In addition, the sensor device 1 according to the embodiment further includes the package substrate 40 that is thermally connected to the heat dissipation surface 23*a* of the Peltier element 20 and accommodates the Peltier element 20 and the sensor element 10 (10A).

As a result, the heat generated in the sensor element 10 (10A) can be efficiently dissipated to the outside via the Peltier element 20 and the package substrate 40 in the sensor device 1 that hermetically seals the Peltier element 20 and the sensor element 10 (10A).

In addition, the sensor device 1 according to the embodiment further includes the relay substrate 30 that is arranged between the cooling surface 21*a* of the Peltier element 20 and the sensor element 10 (10A), and relays the electrical connection between the package substrate 40 and the sensor element 10 (10A).

Thus, electrical characteristics of the sensor device 1 can be improved.

In addition, the sensor element 10 is the SWIR image sensor in the sensor device 1 according to the embodiment.

As a result, sensing that utilizes light having a longer wavelength than visible light can be performed by the sensor device 1.

Although the above description is given regarding the embodiments of the present disclosure, the technical scope of the present disclosure is not limited to the above-described embodiments as they are, and various modifications can be made without departing from the scope of the present disclosure. In addition, the components in different embodiments and modifications can be combined suitably.

For example, the example in which the terminal 45 of the package substrate 40 and the electrode 24 of the Peltier element 20 are electrically connected by the bonding wire 25 has been described in the above-described embodiment, but the terminal 45 and the electrode 24 are not limited to the case of being connected by the bonding wire 25. For example, the terminal 45 and the electrode 24 may be electrically connected by a lead wire or the like.

In addition, the effects described in the present specification are merely examples and are not restrictive of the disclosure herein, and other effects not described herein also can be achieved.

Note that the present technology can also have the following configurations.

(1) A sensor device comprising:
a Peltier element;
a sensor element thermally connected to a cooling surface of the Peltier element; and
a window member that faces a light receiving surface of the sensor element and is made of borosilicate glass.

(2)
The sensor device according to the above (1), wherein
an effective pixel region that receives incident light from the window member is arranged on the light receiving surface of the sensor element.

(3)
The sensor device according to the above (2), further comprising
a support member arranged between the sensor element and the window member,
wherein the support member has an opening that allows passage of the incident light and a frame that supports the window member.

(4)
The sensor device according to the above (3), wherein
the frame is arranged outside the effective pixel region in a plan view.

(5)
The sensor device according to the above (3) or (4), wherein
an area of the opening is larger than an area of the effective pixel region.

(6)
The sensor device according to any one of the above (3) to (5), wherein
the window member is arranged to cover the opening.

(7)
The sensor device according to any one of the above (1) to (6), wherein
the cooling surface of the Peltier element is larger than a surface of the sensor element opposite to the light receiving surface.

(8)
The sensor device according to any one of the above (1) to (7), further comprising
a package substrate that is thermally connected to a heat dissipation surface of the Peltier element, and accommodates the Peltier element and the sensor element.

(9)
The sensor device according to the above (8), further comprising
a relay substrate that is arranged between the cooling surface of the Peltier element and the sensor element, and relays electrical connection between the package substrate and the sensor element.

(10)
The sensor device according to any one of the above (1) to (9), wherein
the sensor element is a short wave infrared (SWIR) image sensor.

REFERENCE SIGNS LIST

1 SENSOR DEVICE
10, 10A SENSOR ELEMENT
10*a* LIGHT RECEIVING SURFACE
11 EFFECTIVE PIXEL REGION
20 PELTIER ELEMENT
21 COOLING SUBSTRATE
21*a* COOLING SURFACE
22 COLUMNAR PORTION
23 HEAT DISSIPATION SUBSTRATE
23*a* HEAT DISSIPATION SURFACE
30 RELAY SUBSTRATE
40 PACKAGE SUBSTRATE
41 RECESS
41*a* BOTTOM SURFACE
43 BOTTOM SURFACE
43*a* BOTTOM HEAT DISSIPATION AREA

44 SIDE SURFACE
44a SIDE HEAT DISSIPATION AREA
46 HEAT DISSIPATION MEMBER
50 PIN TERMINAL (EXAMPLE OF EXTERNAL TERMINAL)
60 WINDOW MEMBER
70 SUPPORT MEMBER
71 OPENING
72 FRAME

What is claimed is:

1. A sensor device comprising:
a Peltier element;
a sensor element thermally connected to a cooling surface of the Peltier element;
a window member that faces a light receiving surface of the sensor element and is made of borosilicate glass; and
a support member, wherein the support member has an opening that allows passage of incident light and a frame that supports the window member, and wherein the window member is disposed above and overlaps a portion of the frame.

2. The sensor device according to claim 1, wherein an effective pixel region that receives incident light from the window member is arranged on the light receiving surface of the sensor element.

3. The sensor device according to claim 2, wherein the frame is arranged outside the effective pixel region in a plan view.

4. The sensor device according to claim 2, wherein an area of the opening is larger than an area of the effective pixel region.

5. The sensor device according to claim 1, the window member is arranged to cover the opening.

6. The sensor device according to claim 1, wherein the cooling surface of the Peltier element is larger than a surface of the sensor element opposite to the light receiving surface.

7. The sensor device according to claim 1, further comprising
a package substrate that is thermally connected to a heat dissipation surface of the Peltier element, and accommodates the Peltier element and the sensor element.

8. The sensor device according to claim 7, further comprising
a relay substrate that is arranged between the cooling surface of the Peltier element and the sensor element, and relays electrical connection between the package substrate and the sensor element.

9. The sensor device according to claim 1, wherein the sensor element is a short wave infrared (SWIR) image sensor.

10. The sensor device according to claim 8, wherein the sensor element and the relay substrate are electrically connected by a bonding wire and a bonding pad.

11. The sensor device according to claim 8, wherein the relay substrate is made of ceramic.

* * * * *